United States Patent [19]

Demaray et al.

[11] Patent Number: 5,565,071
[45] Date of Patent: Oct. 15, 1996

[54] INTEGRATED SPUTTERING TARGET ASSEMBLY

[75] Inventors: Richard E. Demaray, Portola Valley; David E. Berkstresser, Los Gatos; Manuel J. Herrera, San Mateo, all of Calif.

[73] Assignee: Applied Materials, Inc., Santa Clara, Calif.

[21] Appl. No.: 449,618

[22] Filed: May 24, 1995

Related U.S. Application Data

[60] Division of Ser. No. 236,715, Apr. 29, 1994, Pat. No. 5,487,822, which is a continuation-in-part of Ser. No. 157,763, Nov. 24, 1993, Pat. No. 5,433,835.

[51] Int. Cl.$^6$ ................................................. C23C 14/34
[52] U.S. Cl. ........................ 204/192.12; 204/192.13; 204/298.03; 204/298.07
[58] Field of Search .................... 204/192.12, 298.07, 204/298.09, 298.12, 298.2, 192.13, 298.03

[56] References Cited

U.S. PATENT DOCUMENTS

| | | | |
|---|---|---|---|
| 3,630,881 | 12/1971 | Lester et al. | 204/298.09 |
| 3,956,093 | 5/1976 | McLeod | 204/192.12 |
| 4,100,055 | 7/1978 | Rainey | 204/298.12 |
| 4,116,806 | 9/1978 | Love et al. | 204/298.19 |

(List continued on next page.)

FOREIGN PATENT DOCUMENTS

| | | | |
|---|---|---|---|
| 1-147061 | 6/1989 | Japan | 204/298.09 |
| 3-140464 | 6/1991 | Japan | 204/298.09 |
| 4-26760 | 1/1992 | Japan | 204/298.07 |
| WO90/13137 | 11/1990 | WIPO | 204/298.2 |

OTHER PUBLICATIONS

"Influence of Surface Preparation on the Diffusion Welding of High Strength Aluminum Alloys," Ed. D. J. Stephenson, published in *Diffusion Bonding 2*, pp. 101–110.

"Diffusion Bonding of Ti–6A1–4V Alloy: Metallurgical Aspects and Mechanical Properties," Ed. D. J. Stephenson, published in *Diffusion Bonding 2*, pp. 144–157.

Korman, et al., "Research Study of Diffusion Bonding of Refractory Materials, Columbium and Tantalum," *Army Materials and Mechanics Research Center*, Nov. 10, 1967, pp. 1–27.

S. Pineau, et al., "The Investigation and Production of Titanium–Tantalum Junctions Diffusion Bonded at High Temperature (855° C. to 920° C.), etc.," *Royal Aerospace Establishment*, Library Translation 2180, Jan. 1990, pp. 3–34.

*Primary Examiner*—Aaron Weisstuch
*Attorney, Agent, or Firm*—Janis Biksa

[57] ABSTRACT

A target plate assembly completely covers and seals against a top opening of a sputtering processing chamber. Cooling liquid connections are provided only from the perimeter of the target assembly. When a top vacuum chamber seals the side opposite the pressure chamber, the pressure on both sides of the target assembly is nearly equalized. Large thin target assemblies, such as large flat plates used for flat panel displays can be sputtered effectively and uniformly without adverse sputtering effects due to target deflection or cooling deficiencies.

A target, target backing plate, and cover plate form the target plate assembly. The sputtering target assembly includes an integral cooling passage. A series of grooves are constructed in either the target backing plate or the target backing cooling cover plate, which are then securely bonded to one another. The sputtering target can be a single monolith with a target backing plate or can be securely attached to the target backing plate by one of any number of conventional bonding methods. Tantalum to titanium, titanium to titanium and aluminum to titanium, diffusion bonding can be used.

The energized target assembly is protected from adjacent components by overlapping insulators to prevent accidents and isolate the target assembly from other components. An electrical connection to the target assembly remains unconnected until a vacuum is produced in the top chamber.

11 Claims, 26 Drawing Sheets

U.S. PATENT DOCUMENTS

| | | | |
|---|---|---|---|
| 4,166,018 | 8/1979 | Chapin | 204/192.12 |
| 4,175,030 | 11/1979 | Love et al. | 204/298.18 |
| 4,318,796 | 3/1982 | Nishiyama et al. | 204/298.09 |
| 4,405,436 | 9/1983 | Kobayashi et al. | 204/298.16 |
| 4,430,190 | 2/1984 | Eilers et al. | 204/298.12 |
| 4,444,643 | 4/1984 | Garrett | 204/298.2 |
| 4,491,509 | 1/1985 | Krause | 204/192.12 |
| 4,500,409 | 2/1985 | Boys et al. | 204/298.03 |
| 4,564,435 | 1/1986 | Wickersham | 204/298.12 |
| 4,680,061 | 7/1987 | Lamont, Jr. | 165/1 |
| 4,714,536 | 12/1987 | Freeman et al. | 204/298.2 |
| 4,826,584 | 5/1989 | dos Santos Pereiro Ribeiro | 204/298.09 |
| 4,839,011 | 6/1989 | Ramalingam et al. | 204/192.38 |
| 4,904,362 | 2/1990 | Gaertner et al. | 204/192.12 |
| 4,978,437 | 12/1990 | Wirz | 204/192.23 |
| 5,096,562 | 3/1992 | Boozenny et al. | 204/298.22 |
| 5,130,005 | 7/1992 | Hurwitt et al. | 204/192.12 |
| 5,171,415 | 12/1992 | Miller et al. | 204/298.09 |
| 5,180,478 | 1/1993 | Hughes | 204/298.09 |
| 5,244,556 | 9/1993 | Inoue | 204/192.12 |

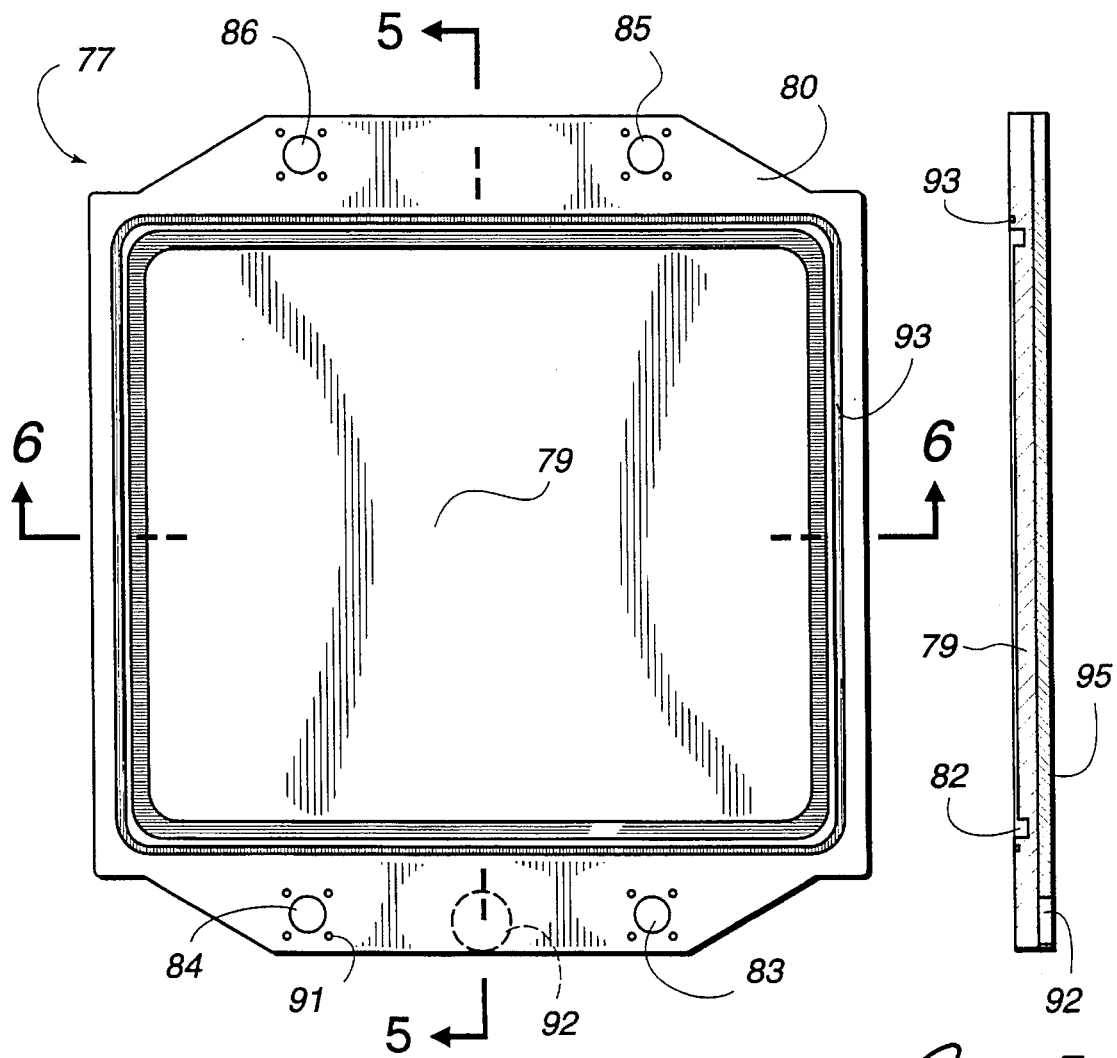
Fig. 4
Fig. 5
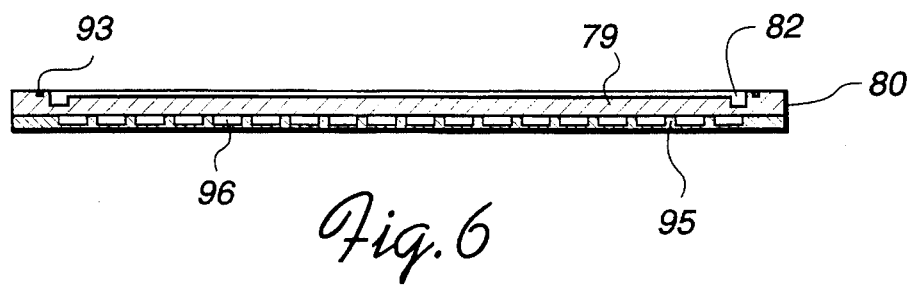
Fig. 6

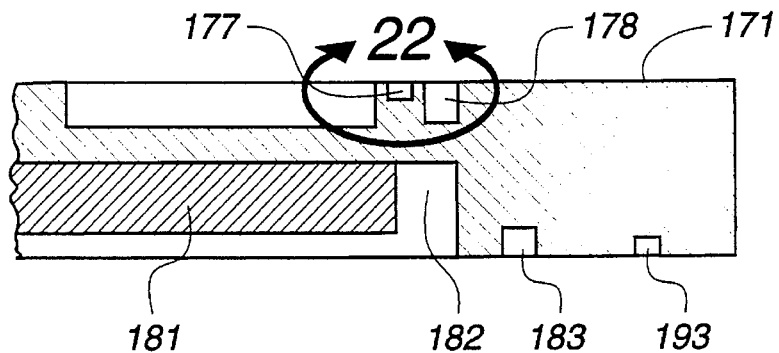
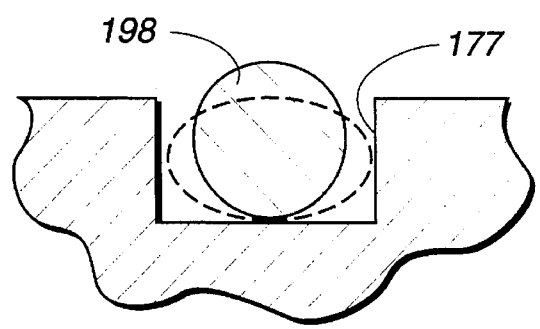
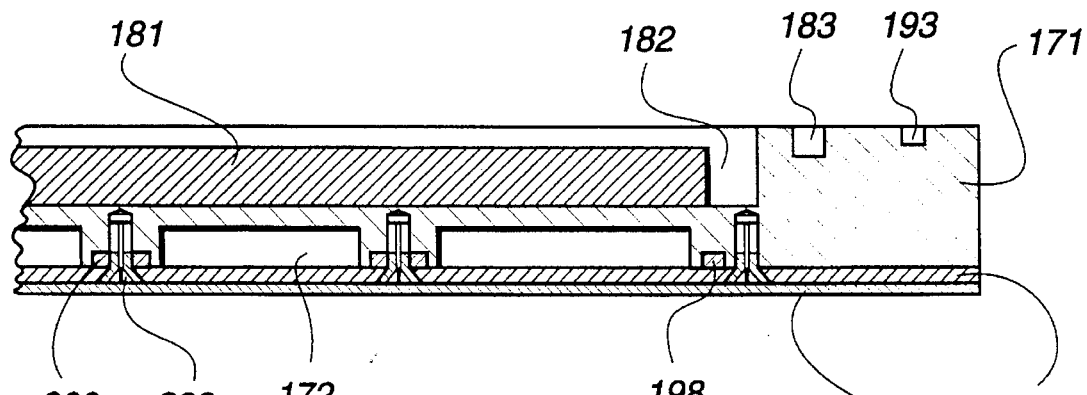
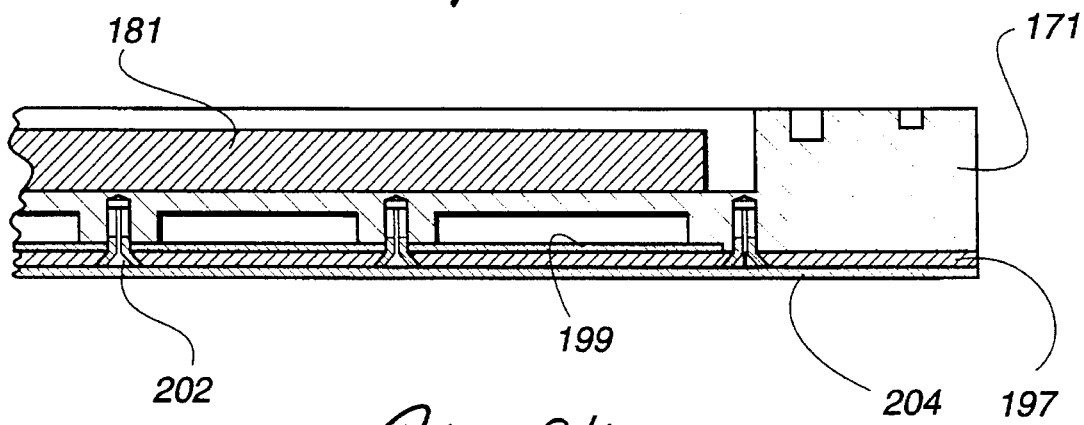

INTEGRATED SPUTTERING TARGET ASSEMBLY

RELATED INVENTION

This application is a divisional application of prior U.S. of application Ser. No. 08/236,715, filed Apr. 29, 1994, now U.S. Pat. No. 5,487,822, which is a continuation-in-part (CIP) of application Ser. No. 08/157,763, filed Nov. 24, 1993, now U.S. Pat. No. 5,433,835 issued Jul. 18, 1995.

FIELD OF THE INVENTION

This invention relates to planar magnetron sputtering targets and more specifically to a structure and method for cooling the sputtering target and a structure and method for holding such a target being cooled.

BACKGROUND OF THE INVENTION

Sputtering describes a number of physical techniques commonly used in, for example, the semiconductor industry for the deposition of thin films of various metals such as aluminum, aluminum alloys, refractory metal silicides, gold, copper, titanium-tungsten, tungsten, molybdenum, tantalum and less commonly silicon dioxide and silicon on an item (a substrate), for example a wafer or glass plate being processed. In general, the techniques involve producing a gas plasma of ionized inert gas "particles" (atoms or molecules) by using an electrical field in an evacuated chamber. The ionized particles are then directed toward a "target" and collide with it. As a result of the collisions, free atoms or groups of ionized atoms of the target material are ejected from the surface of the target, essentially converting the target material to free atoms or molecules. Most of the free atoms which escape the target surface in the direction of the substrate, strike the substrate without intervening collision, and form (deposit) a thin film on the surface of the object (e.g. wafer, substrate) being processed, which is located a relatively short distance from the target.

One common sputtering technique is magnetron sputtering. When processing wafers using magnetron sputtering, a magnetic field is used to concentrate sputtering action in the region of the magnetic field so that target sputtering occurs at a higher rate and at a lower process pressure. The target itself is electrically biased with respect to the wafer and chamber, and functions as a cathode. Objectives in engineering the cathode and its associated magnetic field source include uniform erosion of the target and uniform deposition of pure target material on the wafer being processed. During sputtering, if magnets generating a magnetic field are stationary at a location, then continuous sputtering quickly consumes the sputtering target thickness at that location and generates hot spots at the locations of sputtering. Therefore, the magnets are usually continuously moved over the back of the target during its sputtering. Nonetheless, non-uniform wear patterns persist. To avoid contaminating the process, sputtering is stopped before the non-uniform sputtering wear pattern has consumed the full thickness of the target material at any point. If any point on the target plate behind the target were to be reached, sputtering of the target backing plate material (often copper) would occur, contaminating the vacuum chamber and the water being processed with the target backing material (e.g., copper). Because of the non-uniform pattern of target utilization, conventional practice is to stop the sputtering while a large percentage of the target still remains.

As the target erodes, the distance between the target surface (which is eroding away) and the substrate being sputtered is slowly increasing. The change in the distance between the target surface and the substrate being sputtered creates a change in the qualities of the sputtered material deposited and its uniformity. When large areas such as glass plates are being deposited, variations in the thickness of deposited sputtered material are measurable and may be unacceptable if the change in the target thickness detrimentally affects the deposition of the target material on the substrate being deposited.

Considerable energy is used in generating the gas plasma and creating ion streams impacting on the cathode. This energy must be dissipated to avoid melting or nearly melting the structures and components involved. Common techniques used for cooling sputtering targets are shown in FIGS. 1 and 2. One technique, as used in many prior art sputtering devices, passes water or other cooling liquid through a fixed internal passage of the sputtering target as shown in FIG. 1, a first cooling liquid passageway such as a hose 65 supplies water or other cooling liquid to a target backing plate 63 where it passes through cavities or passages of the backing plate and out a second hose 66. The target 64 is thereby quickly cooled. To complete the picture of FIG. 1, the sputtering chamber 60 includes an object (substrate) support structure 62 on which rests the substrate to be deposited 61. In this configuration the sputtering target is completely immersed in the process environment. A water-to-vacuum seal is often needed to prevent the water or other cooling liquid from leaking out of its passages. A magnetron sputtering cathode as described by Carlos dos Santos Pereiro Ribeiro in his U.S. Pat. No. 4,826,584 is typical of the prior art showing cooling line attachments hidden behind the sputtering target and attached to the back of the target to pass liquid through structures adjacent to the target. While a magnet is not shown in FIG. 1, commonly these devices have stationary or rotating magnets to assist in directing the ion flow and controlling the primary sputtering location.

Another technique which is commonly used which has eliminated the vacuum-to-water seal problem is shown in FIG. 2. A processing chamber 50 includes a sputtering table 56 supporting a substrate 55 to be sputter coated in close proximity to a target 54. The sputtering chamber 50 includes a circumferential top flange on which a target assembly 52 rests. The target assembly 52, consisting of a target backing plate 53 and the target 54, completely covers the flange of the processing chamber 50. A seal is made between the processing chamber 50 and ambient air outside the flange. A cooling chamber 51 encloses the top of the target assembly 52. A stationary magnet or a moveable magnet 57 is located closely adjacent to the back of the target backing plate 53. A magnet sweep mechanism (not shown) causes the movable magnet 57 to move in a magnet sweep zone as shown by the dashed lines 58. The moveable magnet 57 and portions of the magnet sweep mechanism (not shown), in this configuration, are immersed in cooling liquid which generally fills the cooling chamber 51 and is circulated through the chamber behind the target to ensure cooling of the target.

In these configurations the target backing plate 53 is subjected to a strong vacuum pressure on the processing side (less than 1 torr) with a positive pressure of as much as several atmospheres on the cooling side. The actual pressure on the cooling side depends on the weight of the coolant in the cooling chamber and on the static and dynamic pressures of the coolant in the cooling chamber as enough coolant to maintain acceptable temperatures on the sputtering target is moved through the system. To avoid short-circuiting the flow of coolant through the chamber (from the inlet immediately by the shortest path to the discharge), often distribution manifolds or flow directing restrictions are placed in the path of the coolant:to minimize short-circuiting and maximize cooling.

To obtain maximum thermal conduction between the cooling liquid and the target backing plate, it is necessary that the flow regime in the cooling chamber 51 be such that any fluid boundary layer formed at and near the back of the target backing plate 53 be minimized or eliminated. Therefore, laminar cooling flow is not sufficient, the flow must be in the turbulent range to maximize heat transfer between the fluid target and the fluid. Higher fluid pressures are needed to generate the fluid velocities required for turbulent flow resulting in higher pressures in the cooling chamber 51.

For small sputtering targets, the target backing plate and target can be built to be quite massive to resist deflections due to the differential pressures between the vacuum in the processing chamber 50 and the ambient air pressure plus fluid pressure in the cooling chamber 51. When the size of the target and target backing plate become large because the area to be coated is quite large, as might be done for a flat glass panel to be used in a flat panel display of a computer or television screen, the thickness of the target and target backing plate must be substantially increased to avoid unacceptable deflections. When a magnetron is used, sputtering is most effective when the magnets are just behind the surface of the sputtering target. Increasing the distance between the surface of the sputtering target and any magnets used for magnetron sputtering behind the target (by increasing target thickness) substantially decreases the effect of the magnets on sputtering, or conversely, much more powerful magnets need to be used in order to be sure that the magnet field is effective through the thickness of the thicker target and its backing plate. The target assembly, in its present target size of 510 mm×620 mm, or 570×720, however, does not require the top chamber to be under vacuum for the system to operate properly because the deflecting loads due to vacuum from the process-side chamber are small and the coolant loads are all internal to the target assembly.

The deflection of the target and target backing plate under the differential pressure between the processing chamber and the cooling chamber causes the target and target backing plate to bow substantially. Many targets are attached to their target backing plates using a relatively ineffective soldering or brazing technique. The bowing of the target backing plate and target creates an enormous stress in the solder or brazing material, or in the target material if it is softer, such that the probability of de-lamination or separation of the target from the target backing plate is greatly increased. In instances where solder or low temperature brazing has been used, a separation between the target and target backing plate at one point acts as a nucleus for a propagating defect. Once a pinhole surface defect forms, a hot spot develops progressively melting the solder and brazing compounds located there. When sufficient melting and/or separation has occurred, the target will actually drop off the target backing plate, ruining the process and requiting complete replacement of the target, if not a complete cleaning of the process chamber.

Methods that have been used in the past to attempt to overcome these difficulties include high pressure— high temperature diffusion bonding, explosion bonding, friction welding, or roll bonding of the target to its backing plate. In these processes there is a large non-uniform thermal or mechanical gradient to which the target and target backing plate are subjected. The microstructure of the various pieces is affected by the stress induced by thermal gradients or mechanical deflections and the dimensions of the pieces change. Subsequent processing (machining and or thermal stress reduction techniques) must often be used to arrive at a target-target backing plate assembly that is dimensionally stable without warpage under the thermal cycling of sputtering.

The disadvantages of the existing sputtering target systems as described above continue to inhibit the wide use of sputtering as an efficient and cost-effective means for applying surface coatings.

SUMMARY OF THE INVENTION

This invention relates to an improved configuration for a sputtering target and sputtering target backing plate. This configuration overcomes many of the drawbacks of the previous configurations and provides a structure and method to improve sputtering coverage and sputter large areas such as glass plates. In particular, large targets are required when stationary, full coverage deposition is required with high film quality for large substrates.

The new configuration includes a processing chamber having a top circumferential flange surface. A sputtering target assembly is supported on the flange. The target assembly includes a target separate or integral with a target backing plate. In a monolithic (integral) configuration the target (e.g. aluminum and its alloys) and target backing plate can be a single piece of material into which O-ring grooves and other fixtures are machined to seal with the process chamber. In other instances the target material is separate from the target backing plate and is secured to the target backing plate using one of several commonly known joining techniques such as soldering, welding, or brazing. Additional techniques for joining the target to the target backing plate according to this invention include bonding the target to its backing plate by use of diffusion bonding, by filler-metal, solid state, or liquid phase diffusion bonds—all at comparatively low temperatures and pressures.

A cooling cover plate is firmly attached (perhaps bonded) to the back (top) of the target backing plate. The cooling cover plate must be tightly joined with the back of the target backing plate so that a fluid fight seal is created for the cooling fluid. The cooling cover plate has cavities or grooves therein which provide a flow path (passages) for cooling fluid. The cooling fluid cavities or grooves are configured in such a way as to distribute the cooling liquid flow over a substantial area of the target backing plate so as to provide a maximum cooling or heating effect over the whole plate. The grooves are machined or east into the side of the cooling cover plate facing the target backing plate. The grooves or cavities have intermediate fins or walls. When the ends of these fins or groove walls are secured to the backing plate, they help maintain the dimensions of the cooling passages over the wide span of the cooling cover plate. In this way cooling fluid pressure in the cooling passages does not cause bowing of the cooling cover plate or the target and its target backing plate.

The cooling cover plate can be joined to the target backing plate by any reliable means. However, it has been found that in order to reliably join the ends of the fins or intermediate walls of the cooling passage cavities or grooves to the target backing plate, it is sometimes necessary to provide a strong bond such as achieved by using a structural type adhesive, diffusion bonding, or brazing. It is important that the coefficient of thermal expansion of the target backing plate and its cover be closely matched. If not closely matched, then the shear stress associated with differential thermal expansion between the pieces causes bond failure. The differential strain between the target backing plate and a cooling cover plate of different materials can be minimized by using pins at intermediate locations across the field between the edges of the plates. Screws or bolts at intermediate locations can also establish and assure that de-bonding does not take place.

When using a structural type adhesive such as a nitrile epoxy adhesive, the surfaces to be bonded are cleaned and treated (roughened) to improve the adherence of the nitrile epoxy. The adhesive is precisely located on its respective bonding surfaces by being attached to a carrying screen or mesh. In accordance with good work practices, the adhesive is placed on the mesh only at those locations corresponding to places between the cover plate and target backing plate where joining (bonding) is desired. The target backing plate and cooling cover plate are then pressed against each other with a predetermined pressure and heated to a predetermined temperature to assure the bonding of the pieces. Once the nitrile epoxy has set, a very strong bond is created between the cooling cover plate and the target backing plate such that differential pressures of several atmospheres can be applied without failure of the epoxy bond.

The cooling cover plate can also be joined to the target backing plate using diffusion bonding techniques as discussed below for bonding a separate target material to its backing plate.

When the target and target backing plate are separate and need to be joined, there is always concern about the bond between the target and the target backing plate under the locally high temperatures of the process. Diffusion bonding, a technique often used in the aircraft industry to join and guarantee the bonding of critical parts, can be used to bond various target materials to various backing plates such that a failure of the bond in some areas will not cause propagation of the de-lamination over the whole target as happens now with prior art soldering or brazing techniques. For sputtering it is sufficient that there initially be in excess of 70% contact (bonding) between the target and the target backing plate to provide a satisfactory electrical and thermal connection between the two to adequately dissipate the thermal energy delivered to the target plate by the process.

Diffusion bonding at comparatively low temperatures and pressures provides a gentle method of joining of the target to the target plate. Bonding by diffusion permits dimensional stability and bonding reliability while avoiding thermally or mechanically induced stresses due to localized gradients when high pressure—high temperature diffusion bonding, explosive bonding, friction welding, or roll bonding are performed. Also, diffusion bonding can be employed to bond the cooling cover plate to the backing plate at the same time that the target is being bonded to the target backing plate. Various diffusion recipes are identified to bond tantalum to titanium-based materials, titanium targets to titanium, and tantalum to aluminum (and its alloys).

In some cases, preparation of a target assembly using diffusion bonding consists of diffusion bonding the target to the target backing plate. Once the target backing plate is bonded to the target then the target backing plate is bonded to the cooling cover plate using the structural epoxies. Simultaneous with this step, an insulating sheet of glass epoxy laminate (e.g., G-11/FR4) can be bonded over the cooling cover plate, or the laminate may be bonded over the cooling cover plate at a later time.

In other cases, the cooling cover plate and insulating sheet of glass epoxy laminate are formed by a single cast operation using a composite prepreg product that is cast in place. Wax or other material with a low melting point can be formed into the shape (pattern) of the desired cooling flow passages on the back of the target backing plate. A fluid dam formed around the edge of the plate retains a casting material, such as prepreg—an ambient temperature castable structural epoxy that can be reinforced with various forms, tapes and fabrics (e.g., aramid fiber, glass, nylon, etc.) poured over the backing plate to form the cooling passages and insulate the target within the edges of the plate. Once the castable material sets, openings are made to the fluid passage and the assembly is heated to above the melting (or fluidizing) temperature of the pattern material so that the wax (or other pattern material) can be removed leaving cooling fluid passages in the shape of the pattern.

Machining to final dimensions is done once final bonding is complete. Alternately, cooling water passages and grooves can also be provided in the target backing plate. The cooling cover plate is then a flat piece to bond over the cooling passages in the target backing plate. For reusable target assemblies, the target backing cover plate can seal the cooling channel using O-rings with removable fasteners spaced generally regularly across the target backing plate area to bond the cooling cover plate to the target backing plate. Or, a sheet of elastomeric material can be sandwiched between the backing plate and cover plate and squeezed with removable fasteners to act as a gasket to seal the cooling fluid passages.

The target, target backing plate, and cooling cover plate make up a target assembly which is placed over the sputtering chamber. When the target assembly is made in a configuration with a rigid cross section or reinforced to minimize bending, sputtering can take place while the target carries the load of the differential pressure between ambient conditions and the vacuum of the processing chamber.

Alternatively, a top chamber can be put in position to enclose a magnet and be sealed to the top of the target assembly. When sputtering is desired, the pressures in both the sputtering chamber and the top chamber are reduced substantially and nearly equally. The target assembly then acts as a diaphragm separating the two chambers of nearly equal pressure. The cooling fluid flowing through the cooling passages in the target assembly is isolated from both of the vacuum chambers. The strong bond between the target backing plate and the ends of the fins of the cooling cover plate reduces, if not completely eliminates, the deflection of the target assembly and target due to cooling fluid pressures.

A magnet sweeping mechanism placed in the dry top chamber does not need to overcome the resistance of fluid as it would if it were immersed in fluid. Further, since the target assembly is acting as a diaphragm sealing two chambers of nearly identical pressure, the target assembly can be made very thin to decrease the distance between the magnets and the target face.

Many types of high-intensity magnets reduce their magnetic field strength at elevated temperatures. Using a configuration according to this invention, unlike previous configurations where the magnets are immersed in the hot cooling fluid, the magnets' temperature increases very little, if at all, due to the sputtering process. The magnets are located in the top evacuated chamber and there is virtually no conductive heat flow to the magnets and radiative heat flow from the target assembly to the magnets will be quite minuscule as the cooling cover plate face of the target assembly will have a maximum temperature substantially identical with that of the average cooling fluid temperature, e.g. 50° C. At such temperatures, radiative heat transfer is negligible. In addition, because the target assembly is electrically biased, an electrical insulating sheet is often placed over and bonded to the backside of the cooling cover plate. This sheet acts as a barrier and further reduces any heat transfer from the target assembly to the magnets.

The electrically charged target assembly should be isolated from the sputtering process chamber and the top chamber as well as from operator contact. Insulating rings placed above, below, and outside of the target assembly provide such insulation.

Conduction of electrical current through the cooling media becomes negligible when a high purity water or other cooling fluid is used in the cooling passages. An insulating hose material is used to connect the target assembly to outside cooling/heating fluid source(s).

The cooling fluid inlet and outlet flows can be routed through a plastic (acrylic, polycarbonate, etc.) manifold, or hose fittings with quick disconnect type fittings which may be attached directly to the target backing plate. The plastic manifold is bolted to the target backing plate and acts as an insulating barrier together with other insulating pieces to prevent an operator from contacting the highly energized target plate or its electrical connections.

Power is provided to the target plate through a power connection opening. In one configuration, a safety power connector fitting connects electrical power to the target plate only when a vacuum is pulled in the top chamber. The top chamber vacuum urges the safety connector to overcome an elastic barrier to make a tight electrical connection with the target backing plate. In another configuration the safety power connector connects electrical power to the target plate only when vacuum is pulled in the process chamber and a top chamber vacuum safety interlock assures that the target plate assembly is energized only when it is protected by insulating members.

In the configurations as described, very large substrates to be coated can be deposited from targets having sizes substantially equal to the size of the substrates. For instance, large glass panel displays as might be used for large television-like screens whose dimensions are as much as two or three feet or more in any direction could be deposited from the sputtering target and sputtering chambers as described herein. Further, when movable magnets are swept behind a conventional target assembly, the target is irregularly eroded. With the invention, the pressures in the two chambers may be adjusted to control the bow in the target assembly, thereby mechanically adjusting the distance between the target surface and the substrate to be sputtered so that the uniformity of deposition is maintained even when the sputtering target is nearing the end of its useful life. Also, since the pressures in the two chambers can be adjusted to control the bow of the target assembly, the same target thickness and magnet field strength can be used in sputtering systems with small dimensions as is used in sputtering systems having substantially larger dimensions, e.g. to sputter glass panels.

Cooling water supplies are connected to the target assembly outside the vacuum so that all vacuum-to-water seals have been eliminated and failure of any seals will not have a catastrophic effect on the process or the target.

BRIEF DESCRIPTION OF THE DRAWINGS

FIG. 4 is bottom view of a target assembly with screw holes around the cooling passage inlet and outlet openings according to the invention;

FIG. 5 is a cross sectional view of FIG. 4 taken at 5—5;

FIG. 6 is a cross sectional view of FIG. 4 taken at 6—6;

FIG. 21 is a cross section of FIG. 19 taken at section line 21—21;

FIG. 22 is a close-up of the O-ring groove of FIG. 21;

FIG. 23 shows a cross section of a target assembly of FIG. 19 with O-ring passages around the fasteners of the cover plate at its perimeter;

FIG. 24 shows a cross section of a target plate assembly of FIG. 19 using an elastomeric gasket as a seal;

DETAILED DESCRIPTION OF THE PREFERRED EMBODIMENTS

General Structure

An embodiment according to this invention provides a cooling passage sealed within a sputtering target assembly. The target assembly is sealed to a vacuum processing chamber. Cooling fluid flowing through the cooling passages provides cooling to a sputtering target assembly in an efficient manner and avoids water-to-vacuum sealing problems. The target assembly is sealed between two vacuum chambers so as to obtain a predetermined low stress deformation in the target assembly.

Figure 1:
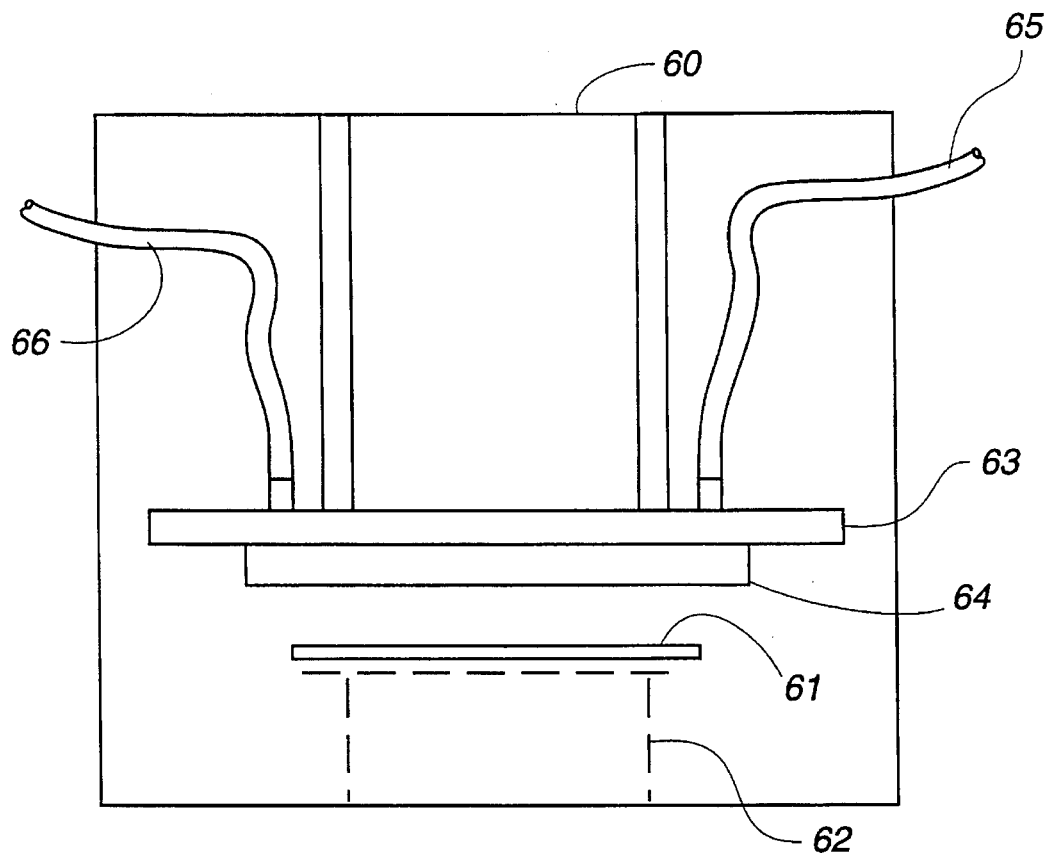
FIG. 1 is a cross sectional view of a prior art sputtering chamber wherein the target and target assembly are immersed within the processing chamber and cooling fluid is provided to the target through seals in the wall of the processing chamber.
Figure 2:
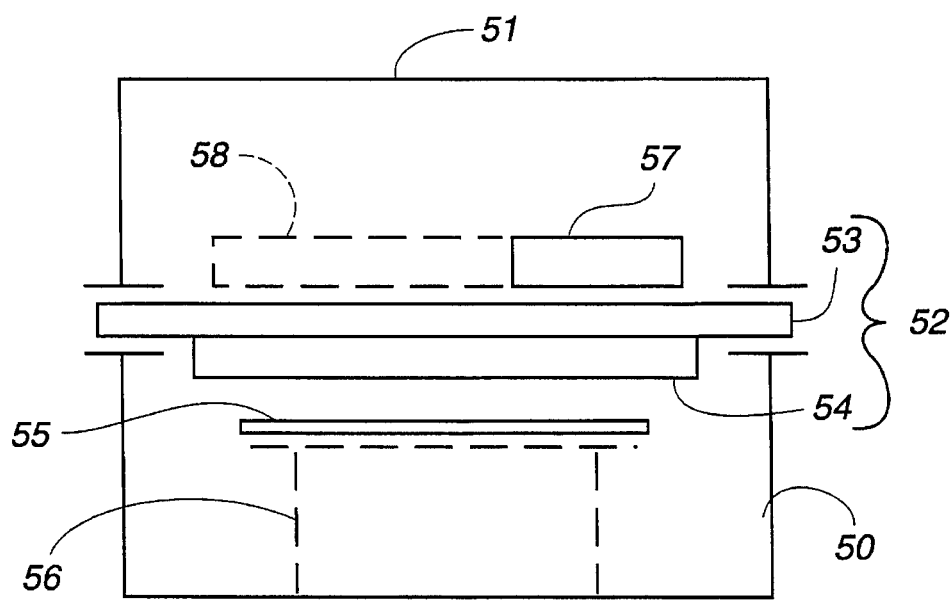
FIG. 2 is a cross sectional view of a prior art sputtering chamber separated from a cooling chamber by a target assembly.
Figure 3:
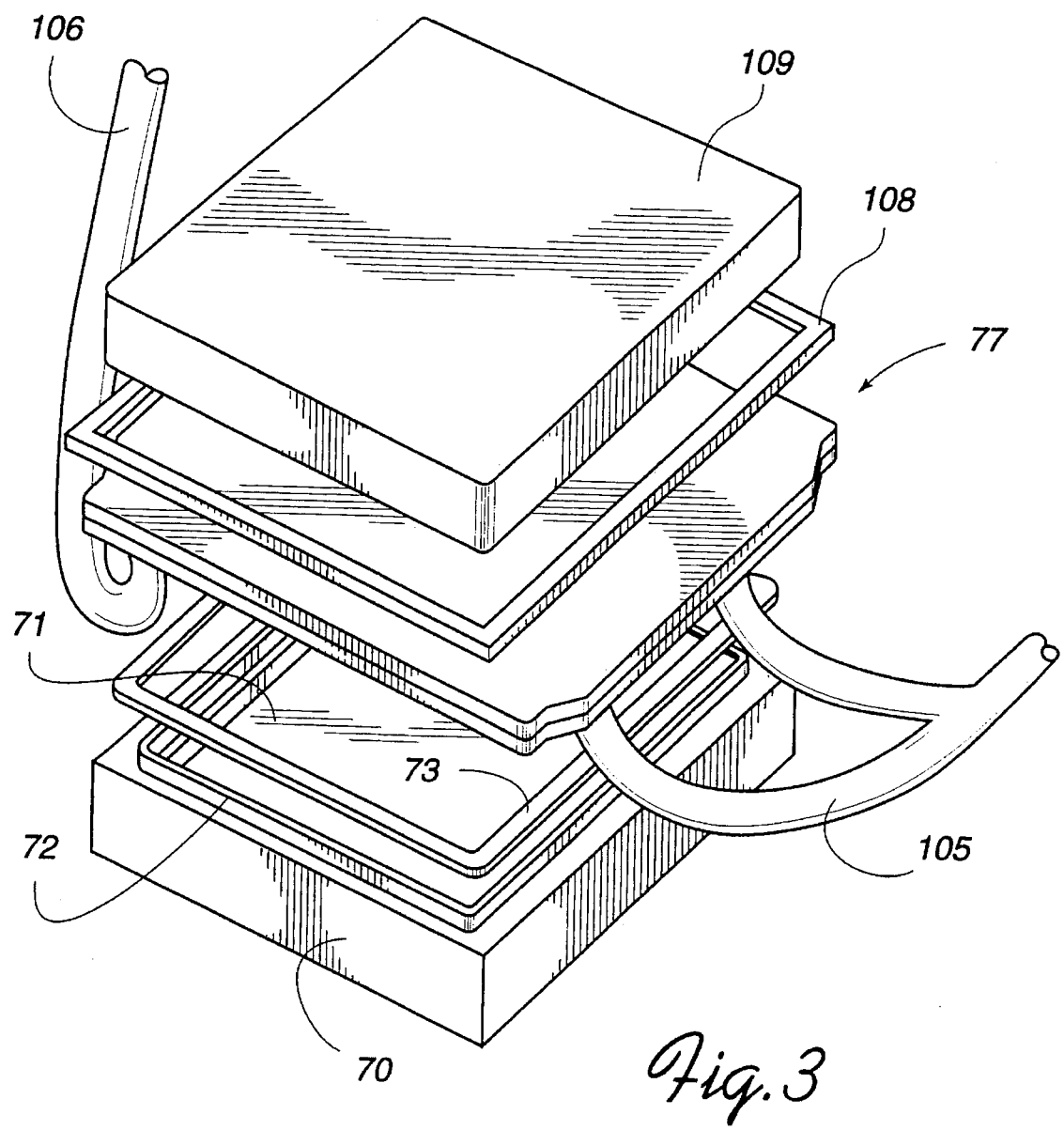
FIG. 3 is an exploded view of an embodiment according to the invention.

A general configuration of an embodiment according to the invention is shown in FIG. 3. A processing/sputtering chamber 70 encloses a substrate 71 to be sputter coated. The target material 127 of a laminated target assembly 77 (item 127 is not seen in FIG. 3 because it is on the underside of the target assembly 77, and illustrated as part of the target assembly in FIGS. 7 through 11) is surrounded by a dark space ring 72 to prevent sputtering of material from beyond the edge of the sputtering target 127. A lower insulating ring 73 (preferably alumina) rests on the top flange of the processing sputtering chamber 70. The laminated target assembly 77 is supported on and sealed to the lower insulating ring 73. Inlet and outlet cooling lines 105,106 provide cooling liquid to the target assembly 77. An upper insulating ring 108 insulates and seals a top chamber 109 from the target assembly 77.

This general configuration as shown in FIG. 3 provides the basis for specific embodiments of the invention as described below.

Target Assembly

Figure 7:
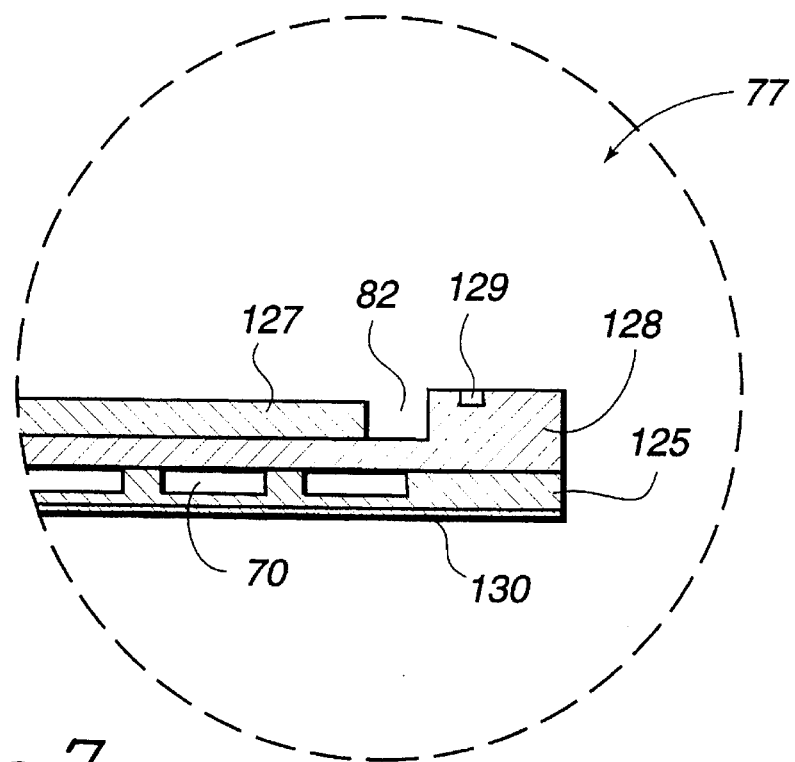
FIGS. 7 and 9 show detailed cross sectional views of a target assembly where the target material is separate from the target backing plate, according to the invention.

FIG. 4 shows a bottom view of the target assembly 77. FIGS. 5 and 6 are perpendicularly opposed cross sectional side views. A target 79 comprising the material to be sputtered is centrally located in the target backing plate 80. The target 79 and target backing plate 80 may be constructed of a single monolithic material, such as aluminum or titanium or the target material may be different from the target backing material, in which case the target material 79 must be securely attached to the target backing plate 80. FIG. 7 shows a cross sectional side view of an edge of a target material different from a target backing plate material.

Figure 8:
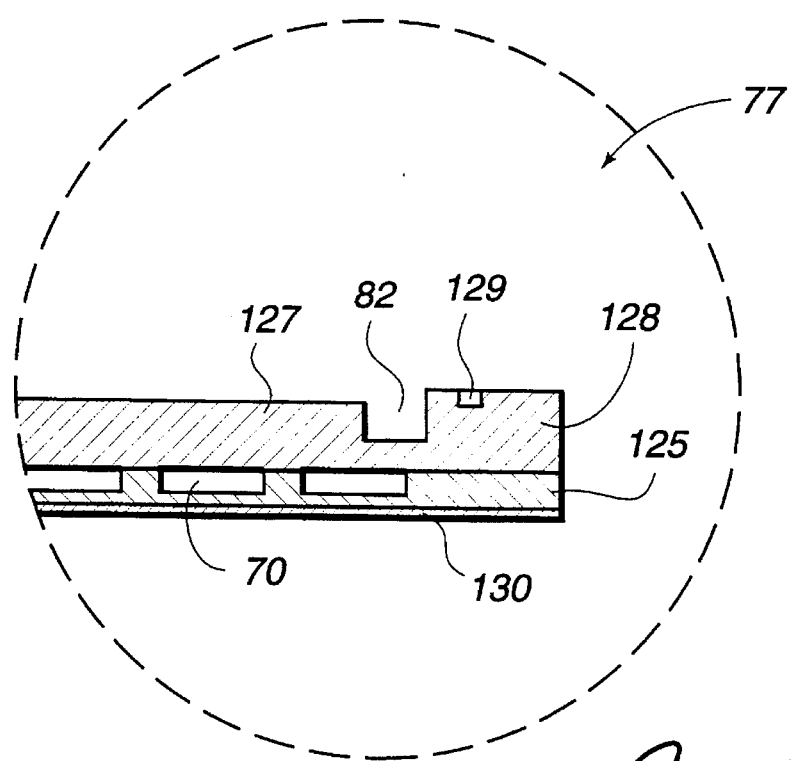
FIG. 8 shows a detailed cross sectional view of a target assembly where the target material is one piece with the target backing plate, according to the invention.

A dark space ring groove 82 surrounds the target 79 (FIG. 6). When then target 127 and target backing plate 128 (as shown in FIG. 8 in a close up cross sectional view) are a monolith (an example of a whole target assembly of which is shown in FIGS. 4, 5, and 6, having similar configuration target 79 and target backing plate 80), this groove 82 is machined (or cast) into the plate. When, as in FIG. 7, the target 127 and target backing plate 128 are of different materials, the lateral distance between the edges of the two pieces 127 and 128 provides this groove 82. An O-ring sealing groove 93 (129 in FIGS. 7 to 11) surrounds the outside of the dark space ring groove 82 and is sized to contain an O-ring (not shown) to seal the target backing plate to the sputtering/processing chamber 70.

Figure 13:
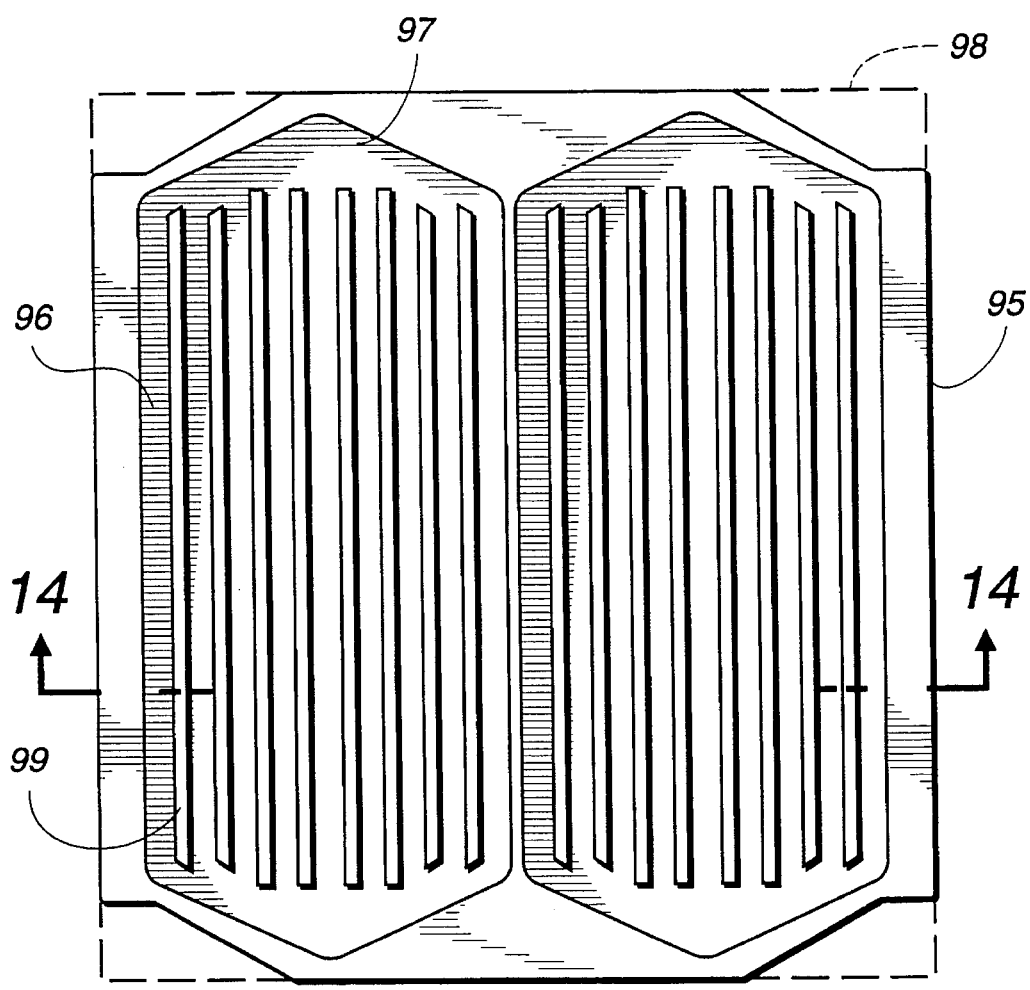
FIG. 13 is a bottom view of a cooling cover plate having generally equal sized cooling grooves according to the invention.
Figure 14:
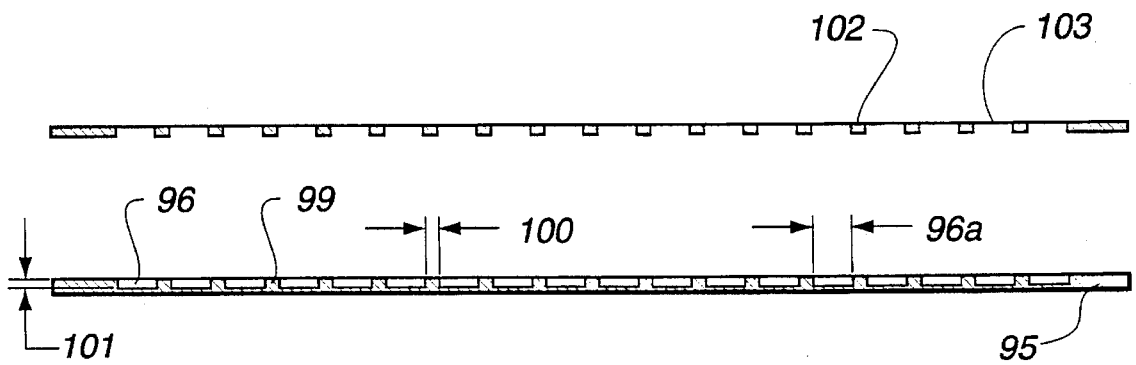
FIG. 14 shows a cross section of FIG. 13 cut at 14—14 and a cross section of a bonding adhesive attached to a mesh for bonding the cover plate to a target backing plate according to the invention.

A cooling cover plate 95 (FIGS. 5, 6, 14 and 16) or 125 (FIGS. 7, 8, and 10) is laminated to the back side of the target backing plate 80. This cooling cover plate 95 has a series of grooves 96 machined, cast or formed by other means into its face (FIG. 13). When its grooved side is to be securely attached (bonded) to the back of the target backing plate 80, as illustrated in FIG. 14, a structural type epoxy adhesive 102 suspended on a mesh 103 similar to the mesh used in a silk screening process is used to apply the adhesive 102 to the cover plate 95. The pattern of the suspended epoxy 102 matches the pattern of the flat surface at the top of the walls 99 separating the grooves 96 forming the cooling fluid passages in the cooling cover plate 95. After the epoxy has been applied to the top of the walls 99, the cooling cover plate 95 is pressed to and heated on the target backing plate 80 to bond the pieces together.

On final machining, a power connection hole 92 (FIGS. 4 and 5) is machined into the cooling cover plate 95 and through the nitrile epoxy bond to be sure that when electrical power is applied to the target it reaches the target backing plate 80 without undue resistance. Similarly, the cooling inlet and outlet openings 83, 84, 85, 86 are finish machined once the bonding of the assembly is complete. When machining is done, care is taken not to breach both pieces.

FIGS. 7, 8, 9, 10, and 11 are close-up views of various configurations of the cross section of target assembly 77. Like numbers identify similar items in different configurations.

FIG. 7 was generally described above when discussing FIGS. 4, 5, and 6. A glass laminate insulating coating 130 covers the back of the cooling cover plate 125.

FIG. 8 illustrates a monolithic target and backing plate, but is otherwise similar to FIG. 7.

Figure 9:
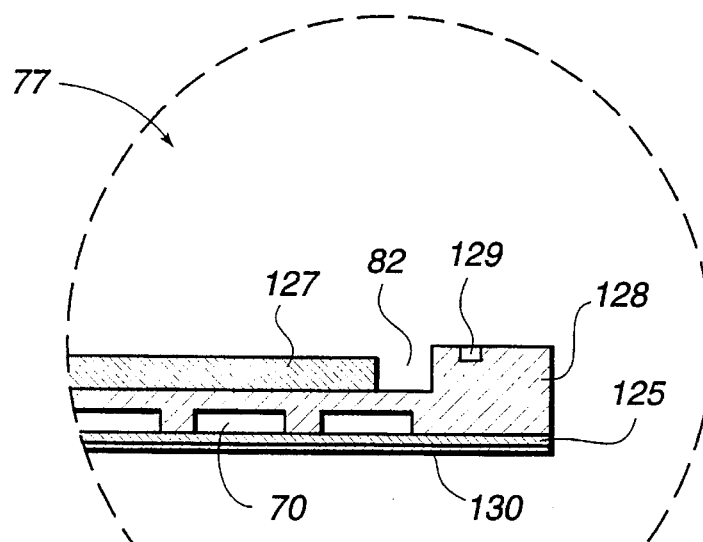

FIG. 9 shows a target 127 securely attached to the target backing plate 128 which has cooling grooves 70 formed therein rather than in the cover plate. In this configuration the cooling cover plate 125 is a flat sheet bonded to the target backing plate 128. A glass laminate insulator 130 covers the cooling cover plate 125.

Figure 10:
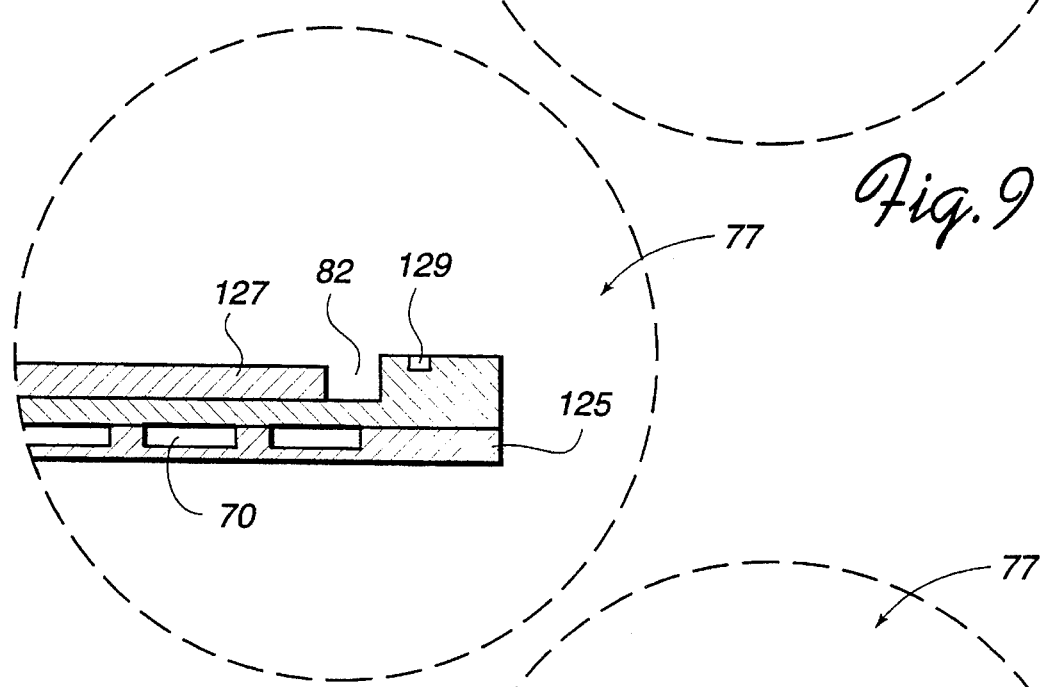
FIG. 10 shows a detailed cross sectional view of a target assembly where the cooling cover plate is made of an insulating material, according to the invention.

FIG. 10 shows the cooling cover plate 125 being made from an insulating prepreg material having cooling grooves 70 therein, thus eliminating the need for a separate glass laminate layer.

Figure 11:
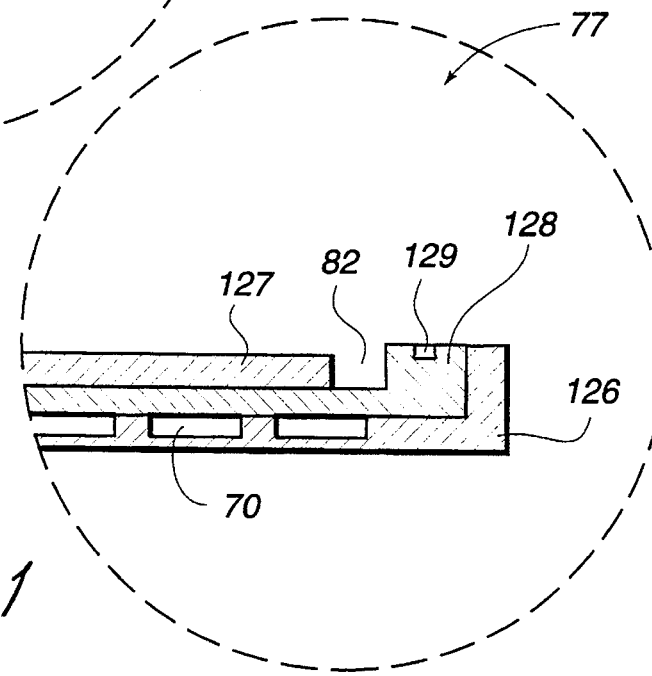
FIG. 11 shows a detailed cross sectional view of a target assembly where the cooling cover plate is made of an insulating material which has been formed around the edges of the target backing plate, according to the invention.

FIG. 11 shows an insulating prepreg material 126 that is formed to wrap around the edges of the target backing plate 128 to partially if not completely eliminate the need for external insulators.

Figure 12:
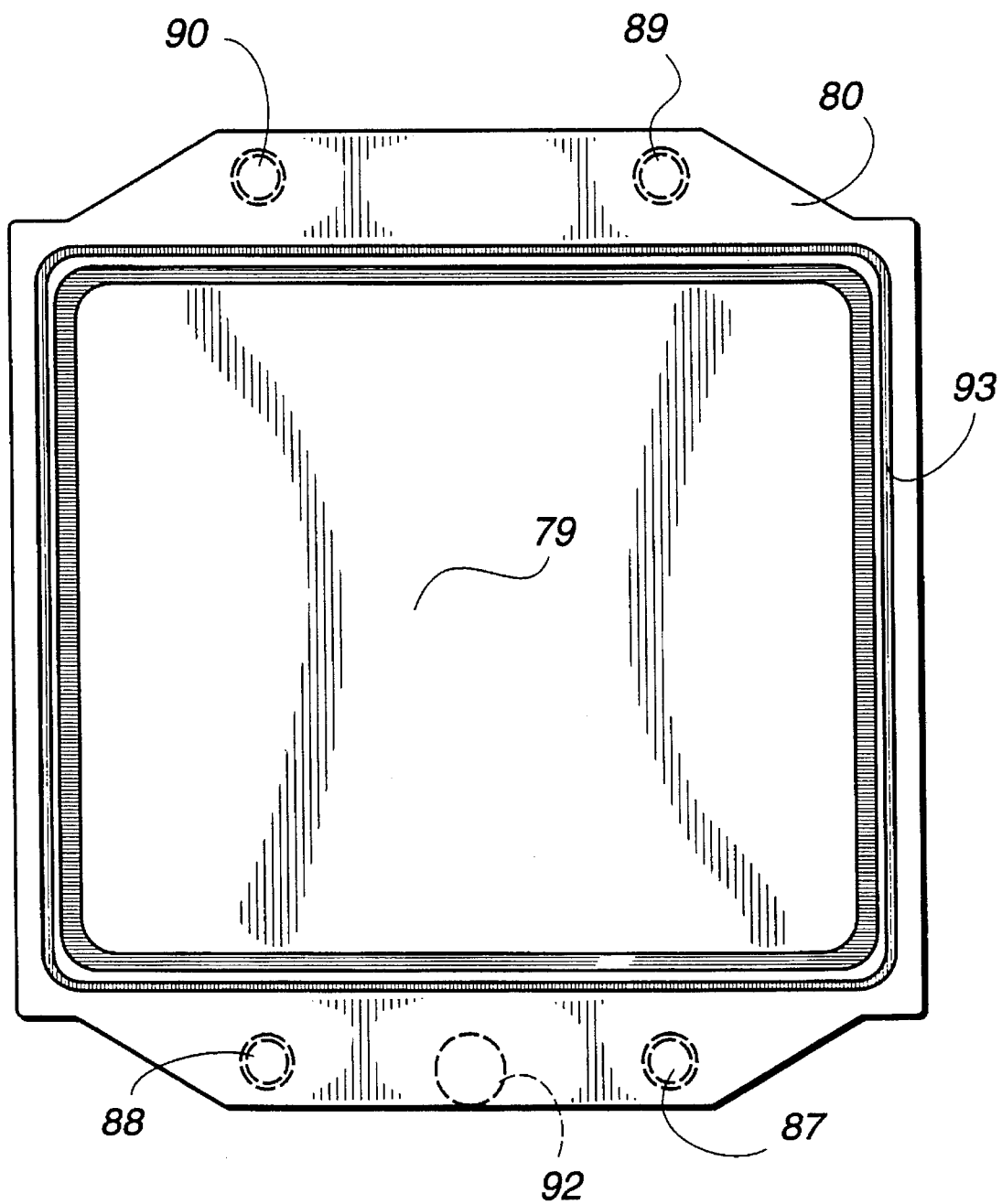
FIG. 12 is bottom view of a target assembly where the cooling passage inlet and outlet openings are threaded and configured to receive cooling fluid hose fittings according to the invention.

In one configuration (FIG. 4) screw holes 91 around the cooling openings 83, 84, 85, 86 provide the means to attach cooling fluid inlet manifolds or hoses to the target assembly on the outside of the vacuum chamber. An example of general hose routing is shown by the hoses 105 and 106 in FIG. 3. In another configuration (FIG. 12) threaded hose-barb fittings are mounted directly to features 87, 88, 89, 90. Non-drip type quick disconnect fittings can be assembled to the other end of the hoses.

In one configuration (FIG. 14) the cooling cover plate 95 has a thickness of 0.425 in. (10.8 mm) wherein the groove width 96a is 1.000 in. (25.4 mm) and the groove depth 101 is 0.25 in. (6.4 mm) while the wall thickness 100 between grooves 96 is 0.375 in. (9.5 mm). A series of coolant distribution collection areas 97 in the cooling cover plate 95 (FIG. 13) distribute and collect the cooling fluid received from the cooling inlet 83, 84 and route fluid to the outlet 85, 86 connection holes in the target backing plate of FIG. 4. Portions of the coolant distribution collection areas 97 in the cooling cover plate 95 and the inlet/outlet connection holes 83–86 in the cooling cover plate 95 are located outside the O-ring sealing groove 93. As a result, the cooling water hoses 105 and 106 (FIG. 3) are connected to the target assembly 77 outside the vacuum chamber, thereby avoiding the major sealing problems with the supplying of cooling water to the target.

The configuration of the walls and grooves in the cooling cover plate can be adjusted so that at a predetermined flow rate and temperature there will be an approximately even mass flow velocity in each groove as there is in its adjoining groove, thereby preventing or reducing the problem of short circuiting and hot spots in areas of the target assembly where fluid flow is likely to be stagnant or nearly so. Also, the spacings of the walls and grooves in the cooling cover plate can be made non-periodic as shown in FIGS. 15 and 16 so that more coolant flow can be directed to the target areas having increased erosion of the target material.

Figure 15:
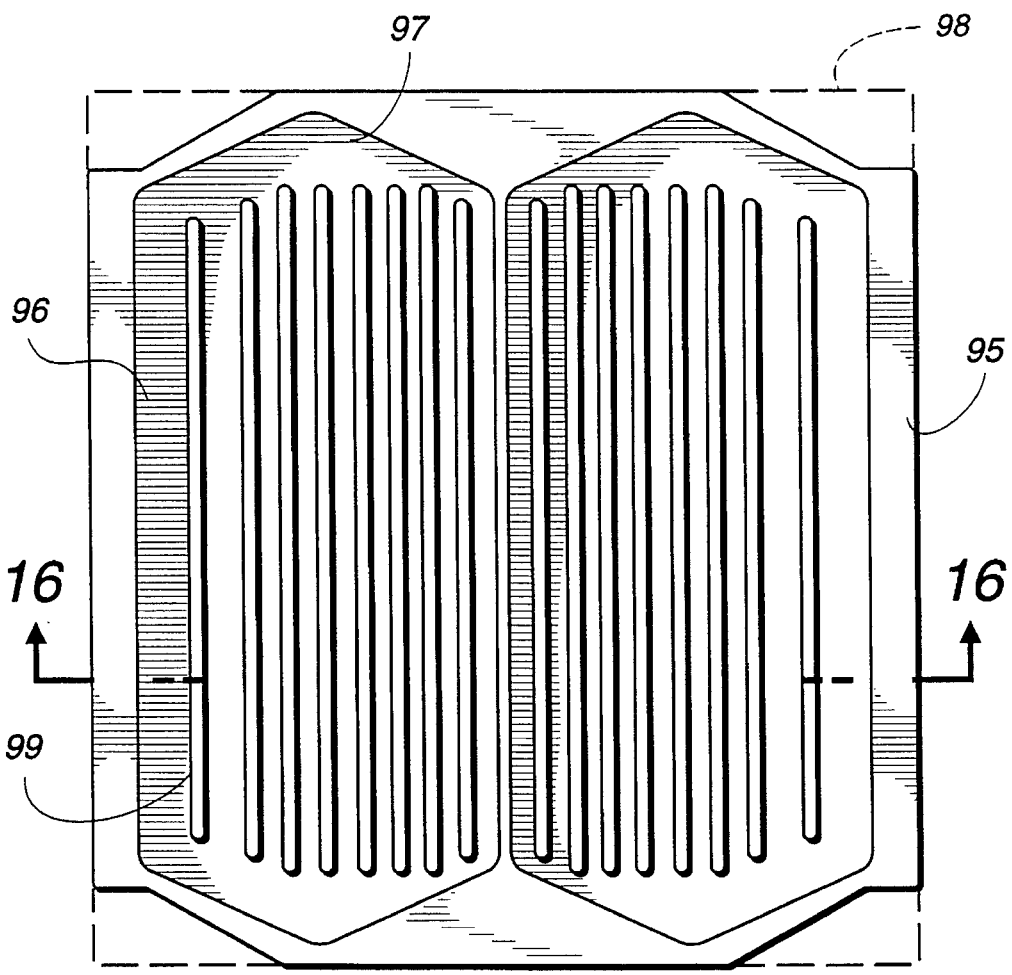
FIG. 15 is a bottom view of a cooling cover plate having cooling grooves with unequal dimensions and spacing according to the invention.
Figure 16:
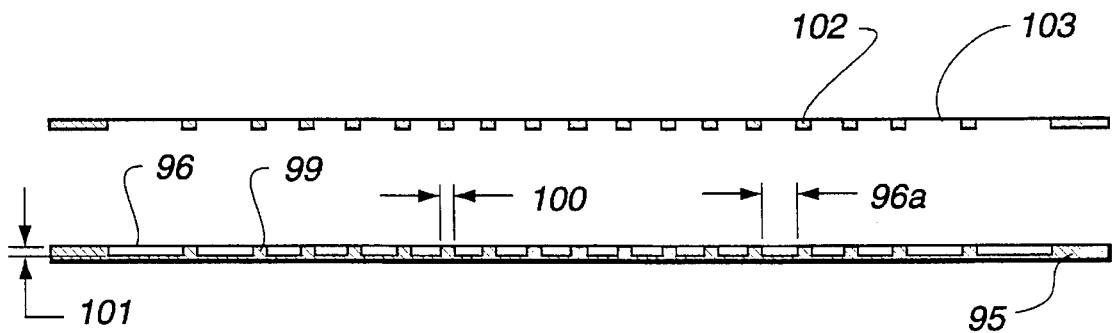
FIG. 16 shows a cross section of FIG. 15 cut at 16—16 and a cross section of a bonding adhesive attached to a mesh for bonding the cover plate to a target backing plate according to the invention.

In the configuration as shown in the FIGS. 15 and 16 the distance between cooling groove walls has been adjusted to reduce the cooling flow near the center of the plate (since two sets of separate passages are shown the narrower grooves appear along the centerline of the plate, i.e., at the medial edge of each of these passages).

In the configurations as shown, cooling flow rates of 5 gallons per minute at inlet coolant (e.g., water) temperatures of 122° F. (50° C.) appear to give acceptable cooling performance.

The solid outline of the cooling cover 95 can be simplified by using a rectangular plate whose corner might be configured as shown for example by the dashed line 98.

The structural adhesive (for example—nitrile epoxy, nitrile phenolic, modified epoxy, and phenolic epoxy) can be acceptably applied using a nitrile epoxy in a 0.013 in. (0.33 mm) thick "FM 300-2K" film adhesive with knit carrier by American Cyanamid Company; Bloomingdale Plant, Havre de Grace, Md., which comes in a sheet-like form attached to a reinforcing/carrying mesh 103 as shown in FIG. 14 and 16. To bond the adhesive according to manufacturer's instructions, the adhesive on the mesh (knit) backing is located on and pressed to the target backing plate 80 by the cooling cover 95 with a pressure of 20±5 psi (0.14+0.03 MPa) on the areas to be bonded and the temperature of all pieces is raised to 250°±5° F. (120°± 3° C.) over 30 minutes. The 250° F. (120° C.) temperature is then maintained for 90 minutes during which curing of the adhesive takes place. Air cooling is then allowed. For superior results when bonding with FM 300-2K and its parent FM 300 (–M or –K) adhesives, curing pressures in an Autoclave (e.g., a heated nitrogen-pressurized chamber) should be set to 50±10 psi (3.45±0.69 MPa) while holding at a curing temperature of 350° F. (177° C.) for 90 minutes. These adhesives can be obtained under various trade names from several U.S. manufacturers and are currently being used, for example, to bond the structural members of landing gear and cargo floors for commercial aircraft.

Figure 17:
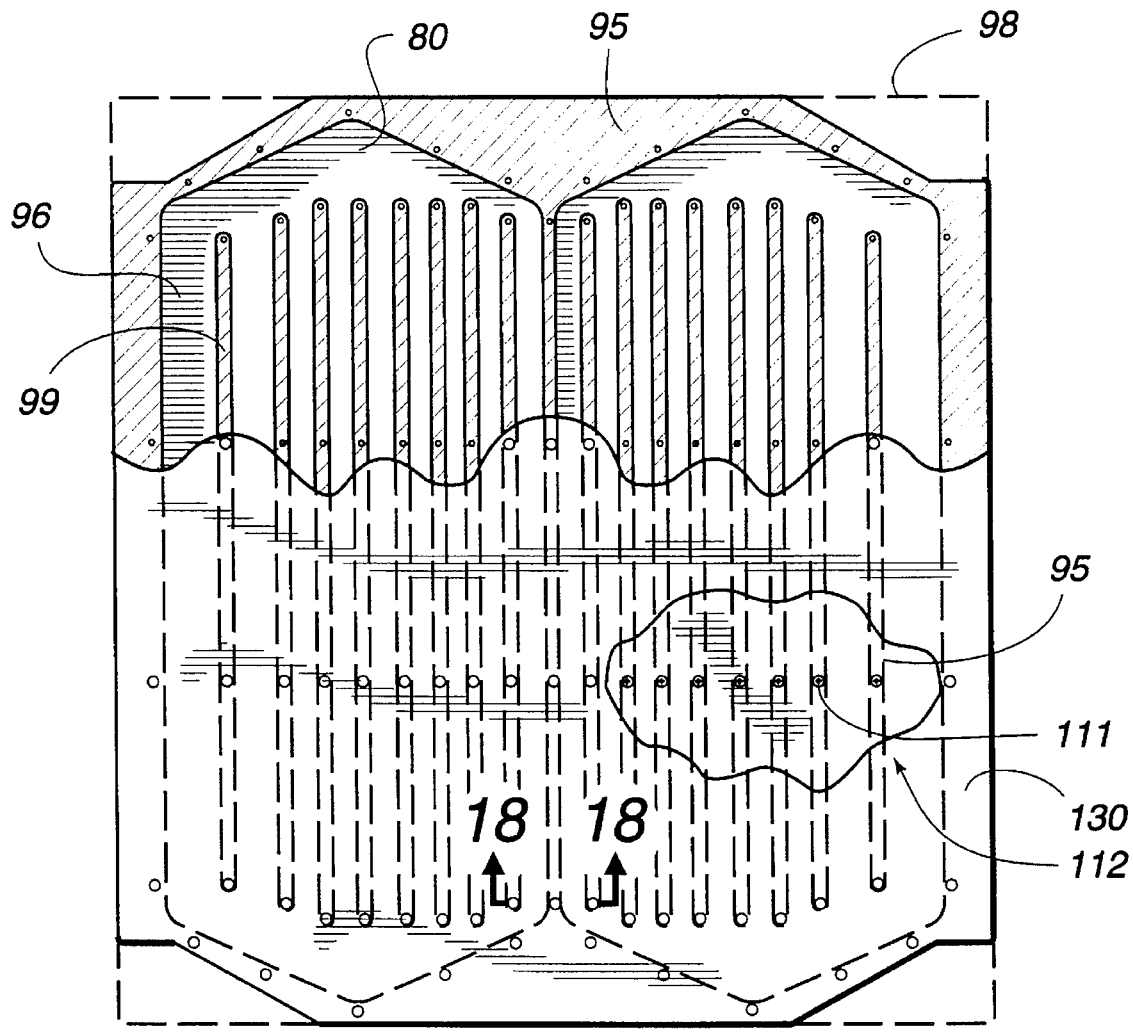
FIG. 17 is a bottom view of a cooling cover plate having mechanical fastening aids according to the invention.
Figure 18:
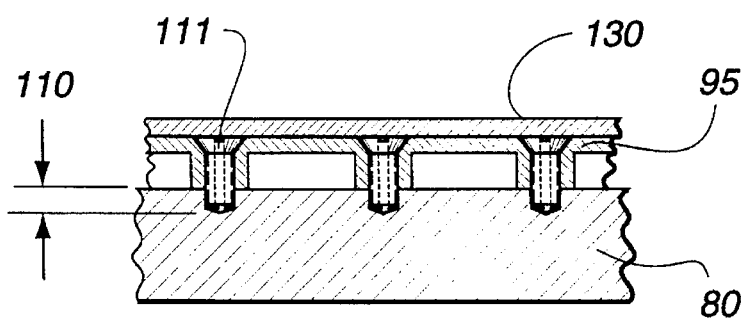
FIG. 18 shows a cross section of FIG. 17 cut at 18—18 and a cross section of a bonding adhesive attached to a mesh for bonding the cover plate to a target backing plate according to the invention.

When reinforcement of the bonding adhesive is desired, corresponding holes can be made in the cooling cover plate and target backing plate (FIGS. 17 and 18). Press fit pins or screws put into the holes prevent differential movement between the pieces. The holes through the cooling cover plate are made through the fins (groove walls) so that the cooling passages remain clear and are not distorted.

Figure 19:
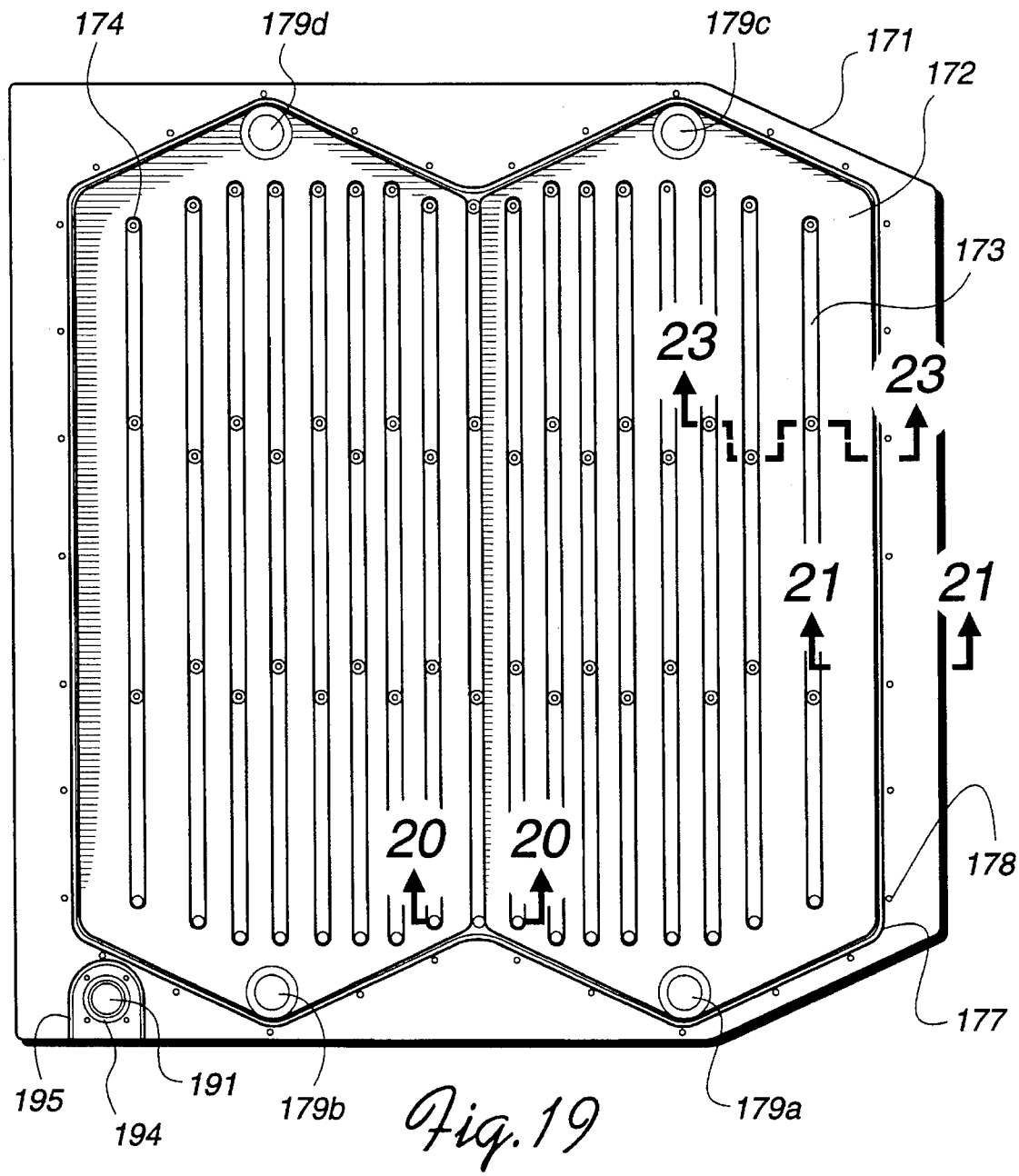
FIG. 19 is a plan view of a back side of a target backing plate whose cooling passage is sealed by O-rings and fasteners.

FIGS. 17 and 18 show the bonding of the cooling cover plate 95 being reinforced by pins or screws 111 which extend only a short distance 110 (e.g. 0.25 (6.35 mm)) into the target backing plate 80. An insulating glass laminate 130 covers the top of pins or screw head 111. The hole patterns of the screws 111 are shown in FIGS. 17 and 19. The cut out 112 shows a view with the glass laminate covering the screw heads cut-away. FIG. 18 shows a cross sectional view of an example of the pin or screw 111 connections.

Another embodiment according to the invention is shown in FIGS. 19 through 28.

As shown in FIG. 19 the side opposite the target side of a target backing plate 171 includes cooling cavity/fluid channels 172 having walls 173 between the cooling channels 172. Instead of a target backing plate cover 197 being fastened to the target backing plate 171 by a nitrile epoxy alone or nitrile epoxy assisted by a fastening system, the configuration shown (FIGS. 23–26) has its target backing plate cover 197 attached to and sealed against the cooling channels 172 of the target backing plate 17 1 using screw-type fasteners 202. The fasteners 202 deform a seal (preferably O-rings, a pinched metal seal, a flat seal, or a quad-ring) 201 located in fastener recesses 174 throughout the central area of the target backing plate 171 (FIGS. 19 and 20) to seal the fastener holes and deform a perimeter seal (preferably O-rings, a pinched metal seal, a flat seal, or a quad-ring) 198 (FIG. 22) placed in a perimeter O-ring groove 177 surrounding the target central area to seal the perimeter. The O-ring groove 177 is positioned closely adjacent to the edge of the cooling cavity 172. This sealing in close proximity to the cooling channel minimizes the amount of target backing plate area exposed to cooling fluid. The close sealing also provides space on the outside of the seal for a vacuum passage 191 to the top chamber 209 (FIG. 36) and space outside the liquid cavity for an electrical connector 155 (FIG. 33) to contact the surface of the target assembly.

The fastener recesses 174 (FIG. 20) inside the perimeter O-ring 198 include a counterbore 176 to receive the O-ring 201 or other seal type. When the O-ring 201 is inserted into the counterbore 176 and is compressed by the screw-type fastener 202 pressing the target backing plate cover 197 to the target backing plate 171, the O-ring 201 is slightly flattened and seals its fastener opening.

Figure 20:
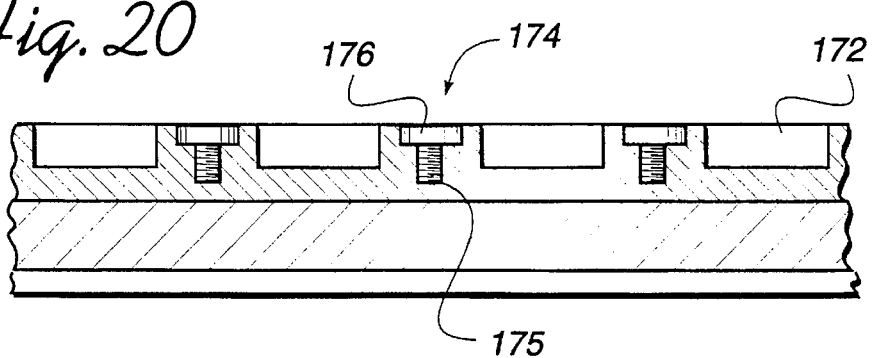
FIG. 20 is a cross section of FIG. 19 taken at section line 20—20.

FIG. 20 shows a cross section of FIG. 19 cut at section line 20–20. The threaded hole 175 sits below the counterbore 176 of the fastener recess 174. O-rings 201 (FIG. 26) are not shown in place in FIG. 20. The fastener recesses are located adjacent to the cooling cavity 172 and on top of the cooling channel wall 173.

FIG. 21 shows a cross section of the outside perimeter of FIG. 19 cut at section line 21—21. The perimeter O-ring groove 177 sits just outside the cooling cavity 172 and adjacent to outside threaded holes 178 which receive threaded fasteners. These perimeter threaded fasteners do not have a counterbore as the outside holes 178 are on the non-fluid side of the perimeter O-ring 198 which seals against fluid leakage.

FIG. 22 shows a close-up of the perimeter O-ring groove 177 without the fastener shown. An O-ring 198 when placed in the groove extends beyond the top of the groove 177 as shown with a solid-line O-ring in FIG. 22. When the target backing plate cover 197 is attached, the O-ring 198 is squeezed and changes its cross sectional configuration approximately as shown by the dashed lines portraying the squeezed O-ring in FIG. 22.

Leakage from the fluid chamber to the top vacuum chamber is prevented by two sets of O-rings and an ambient drain between the O-rings. Water intrusion from the cooling passages into the rough vacuum system (highly unlikely) is prevented by the O-ring groove 194 surrounding the vacuum passage opening 191 and by a U-shaped ambient air drain channel 195 which drains any leaking fluid to the outside before it reaches the vacuum passage 191.

FIG. 23 shows a target assembly sealed by a fasteners and a sealing means as discussed above. The sealing means 200 is placed in the fastener recess.

FIG. 24 shows an elastomeric sheet being used as a gasket 199 to seal the target backing plate 171 against the backing cover plate 197 in the area of the cooling channels. A gasket recess is provided to provide space for the gasket material in the configuration as shown, or the gasket material can be the full size of the target assembly and extend all the way to the edge of the assembly.

Figure 25:
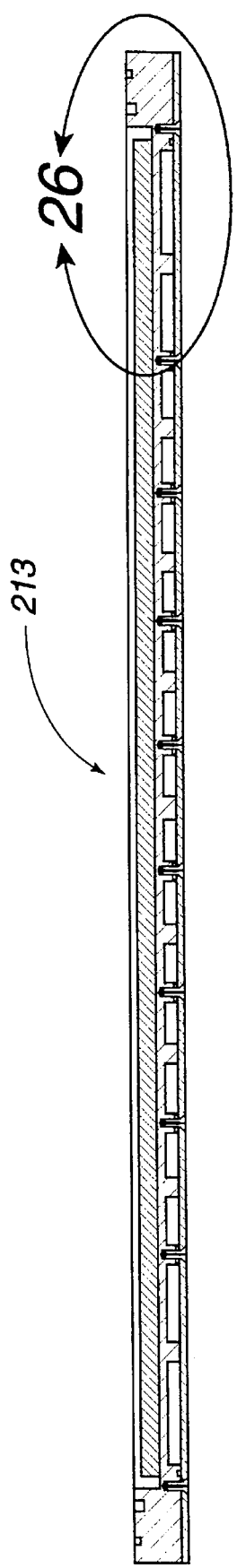
FIG. 25 is a cross sectional view of FIG. 27 taken at section line 25—25.
Figure 26:
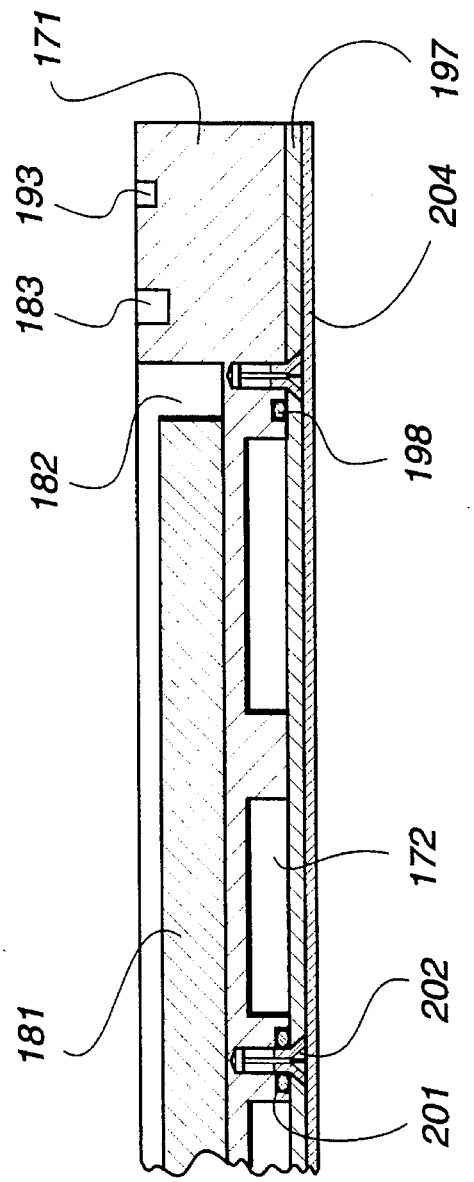
FIG. 26 is a close-up view of FIG. 25.
Figure 27:
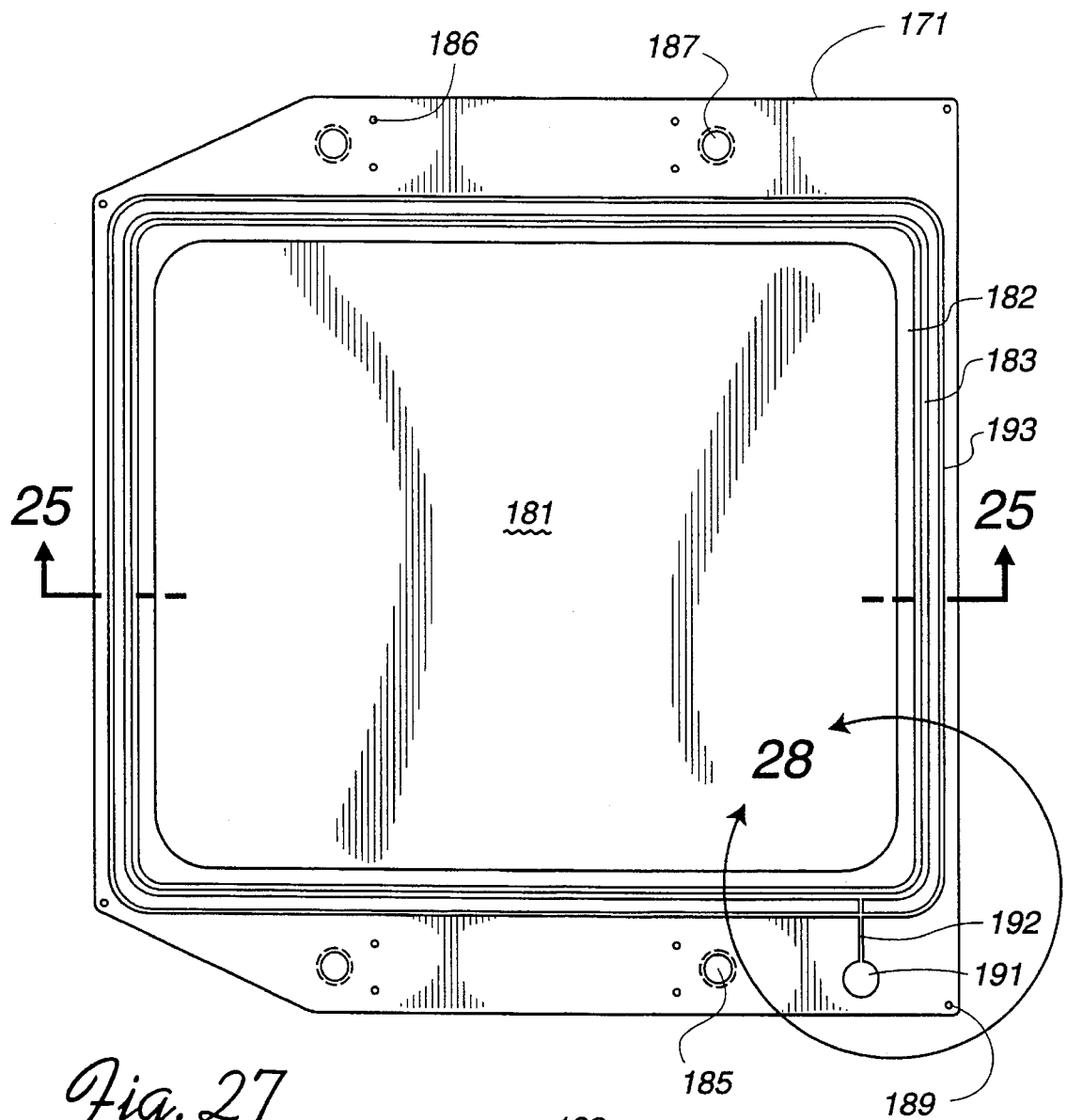
FIG. 27 is a plan view of the target side of an assembled target backing plate utilizing the target backing plate shown in FIG. 19.

FIG. 25 shows a cross section of a target assembly 213 of FIG. 27 cut at section line 25—25. FIG. 26 is a close-up view of FIG. 25. The target 181 is bonded, using solder or brazing bonding techniques to the target backing plate 171. The target backing plate 17 1 has cooling channels 172 therein sealed by O-rings, as previously described. The fasteners 202 countersunk into the target backing cover plate are preferably made of aluminum or other non-magnetic material. The top surface of the target backing cover plate 197 is then coated with a G-11 glass coating 204. The G-11 glass coating 204 is approximately ¹⁄₁₆" (1.59 mm) thick and is attached to the cover backing plate by some fasteners (not shown) at its perimeter, or by an easy-to-peel adhesive which is used so that the G-11 can be removed and the target assembly disassembled. To re-use a target backing plate 171, a used target 181 needs to be removed and a new target needs to be attached. While the target backing plate can on occasion be disposable, in instances where the cost of material is high, it can be recycled using this configuration. The fasteners and O-rings are removed prior to applying heat to the target backing plate. The used target is then removed and a new target material bonded.

Figure 28:
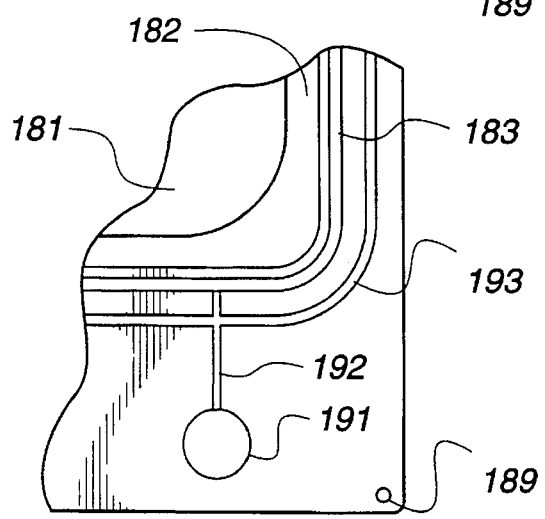
FIG. 28 is a close-up detail of the vacuum passages and sealing as shown in FIG. 27.

FIGS. 27 and 28 show the target side of the target backing plate 171. The centrally located target material 181 is surrounded by the dark space ring cavity 182. The flange surrounding the cavity includes two grooves 183 and 193. An internal groove 183 carries a sealing O-ring, and an empty middle groove 193 distributes rough vacuum system pressure around the outside of the inner sealing O-ring and around the inside of the seal provided by an O-ring within the lower outer insulator upper O-ring sealing groove 229 (FIG. 38) of an opposing part that is pressed against the target plate 191. This middle groove 193 assures that the rough vacuum is distributed completely around the exterior of the internal sealing O-ring (not shown) located in groove 183. This assures that the benefits of a differentially pumped seal is provided all around the perimeter of the processing chamber. The perimeter collecting vacuum passage groove 193 connects via a straight-connecting vacuum passage groove 192 to the through hole 191 passing vacuum through the target assembly and to the perimeter edge of the O-ring groove 183.

As shown in FIGS. 27 and 28, at the corners of the target backing plate 171 on the target side, dowel holes 189 are provided in which glass, plastic or other preferably non-insulating dowels can be used to align the target assembly to the processing chamber.

Connection of Target to Target Backing Plate

Securing the connection between the target and target backing plate can be done by diffusion bonding.

Figure 29:
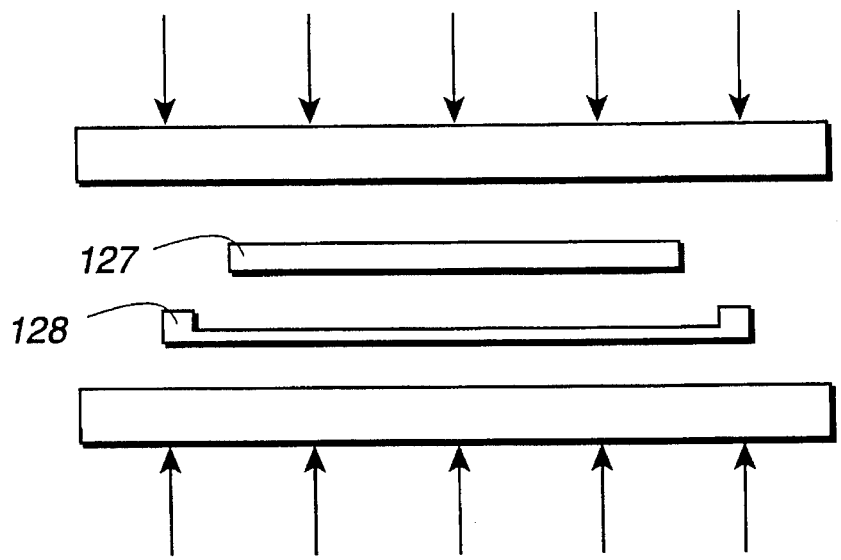
FIG. 29 shows a schematic view of diffusion bonding a target and a target backing plate according to the invention.

When performing diffusion bonding of a tantalum target 127 to a titanium backing plate 128, as shown in FIG. 29, the following process may be followed. The surfaces to be bonded are polished with No. 600 emery paper to a ground finish of 0.1 µm, and just before bonding the surfaces are chemically cleaned following The American Society for Metals (ASM) (more recently known as ASM International) procedures for etching both titanium and tantalum. Press the tantalum target 127 to the titanium 128 at 2 MPa (290 psi) while heating the assembly to 750° C. The assembly temperature should be increased to 875° C. and 885° C. while maintaining the contact pressure at temperature for 60 minutes.

For superior bond quality, the following steps should be followed: The surfaces to be bonded are polished with No. 600 emery paper to a ground finish of 0.1 µm, and just before bonding the surfaces are chemically cleaned following the ASM procedures for etching both titanium and tantalum. The tantalum is pressed to the titanium at 50 MPa (700 psi) while heating the assembly to 750° C. The assembly temperature is then increased to 875° to 885° C. for 1 hour while maintaining a contact pressure of 5 MPa (700 psi). During cooling the load should also be maintained. All diffusion bonds must be done in either an inert gas atmosphere or under high vacuum ($10^{-7}$ to $10^{-9}$ torr).

High strength bonds of titanium to titanium or bonds of titanium to Ti/6Al/4V can be achieved by heating the plates to 850° C. (1562° F.) while holding them together at 100 psi (0.69 MPa) for at least two hours. In this way, pure titanium (target material) can be diffusion bonded to a backing plate of commercially pure grade titanium (e.g., CP Grade 2) or to Ti/6Al/4V (Ti/6Al/4V is also available in Extra Low Interstitial (or ELI) oxygen to improve the bond quality). Preparation of the titanium bond surfaces is the same as described for tantalum-to-titanium bonds. Likewise, bonding must be done in either an inert gas atmosphere or under vacuum. Following the diffusion bonding manufacturing step, the cooling cover plate 125 can be epoxy-bonded to the back of the backing plate 128. An insulating sheet 130 of G-11 glass epoxy laminate may be bonded concurrently over the cooling cover plate 125 or may be bonded over the cover plate at a later time.

Figure 30:
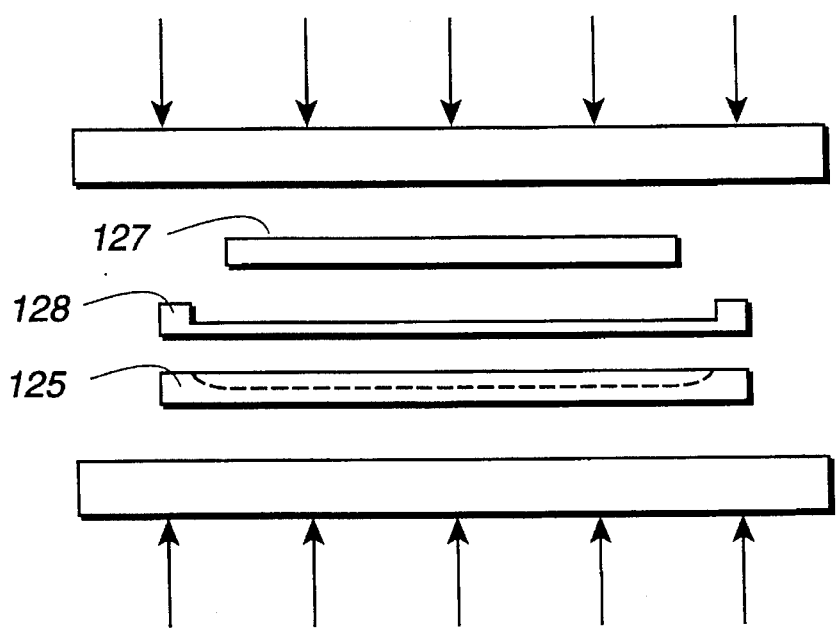
FIG. 30 shows a schematic view of diffusion bonding a target, a target backing plate, and a cooling cover plate according to the invention.

If the cooling cover plate 125 is made of commercially pure titanium or Ti/6Al/4V, it is also possible to diffusion bond the cooling cover plate 125 to the target backing plate 128 by diffusion bonding, for example as shown in FIG. 30. A superior watertight quality bond is obtained by holding the plates at 4 MPa (580 psi) while heating to 850° C. (1562° F.) at a rate of 0.4° C./sec (0.7° F./sec), holding for 90 to 100 minutes at 4 MPa, and slowly cooling at a rate of 0.1° C./sec (0.18° F./sec). The diffusion bonding then takes place at the same time as bonding of the pure titanium target to its backing plate. An insulating sheet 130 of G-11 glass epoxy laminate, if required, can be bonded over the cooling cover plate 125 at a later time.

Aluminum can also be diffusion bonded. A difficulty with diffusion bonding of aluminum is that pure aluminum, upon exposure to an oxygen-containing environment immediately reacts with the oxygen to form an aluminum oxide layer on the surface of the aluminum. This aluminum oxide layer is chemically very stable and is generally impervious to diffusion bonding. However, if the aluminum oxide layer is removed or reduced by scratched-brushing or other mechanical or chemical means or by sputter etching in an inert gas atmosphere or preferably in an oxygen free atmosphere e.g. $10^{-8}$ torr base pressure with a $CO/CO_2$ ratio of $10^8$ to $10^9$ or an $H_2/H_2O$ ratio of $10^7$ to $10^8$, the removal of the oxide film will facilitate diffusion bonding at lower temperatures and pressures than done today.

The target assembly is then pressurized to approximately 500 psi (3.45 MPa) and diffusion bonded by raising the target assembly's temperature to approximately 420° C. for approximately 4 hours. The diffusion resistance of aluminum oxide is reduced or avoided by the surface removal or treatment in an inert gas environment or oxygen free vacuum environment.

Alternately, the process of Herrera and Hosokawa can be used in which the aluminum is sputter deposited in a high vacuum, and the parts are in situ diffusion bonded without exposing the aluminum to oxygen.

Similarly, a titanium-to-tantalum, tantalum-to-aluminum and titanium-to-aluminum bond can be created by diffusion bonding or a diffusion-like brazing process.

Mating of Target Assembly To Chamber

Figure 31:
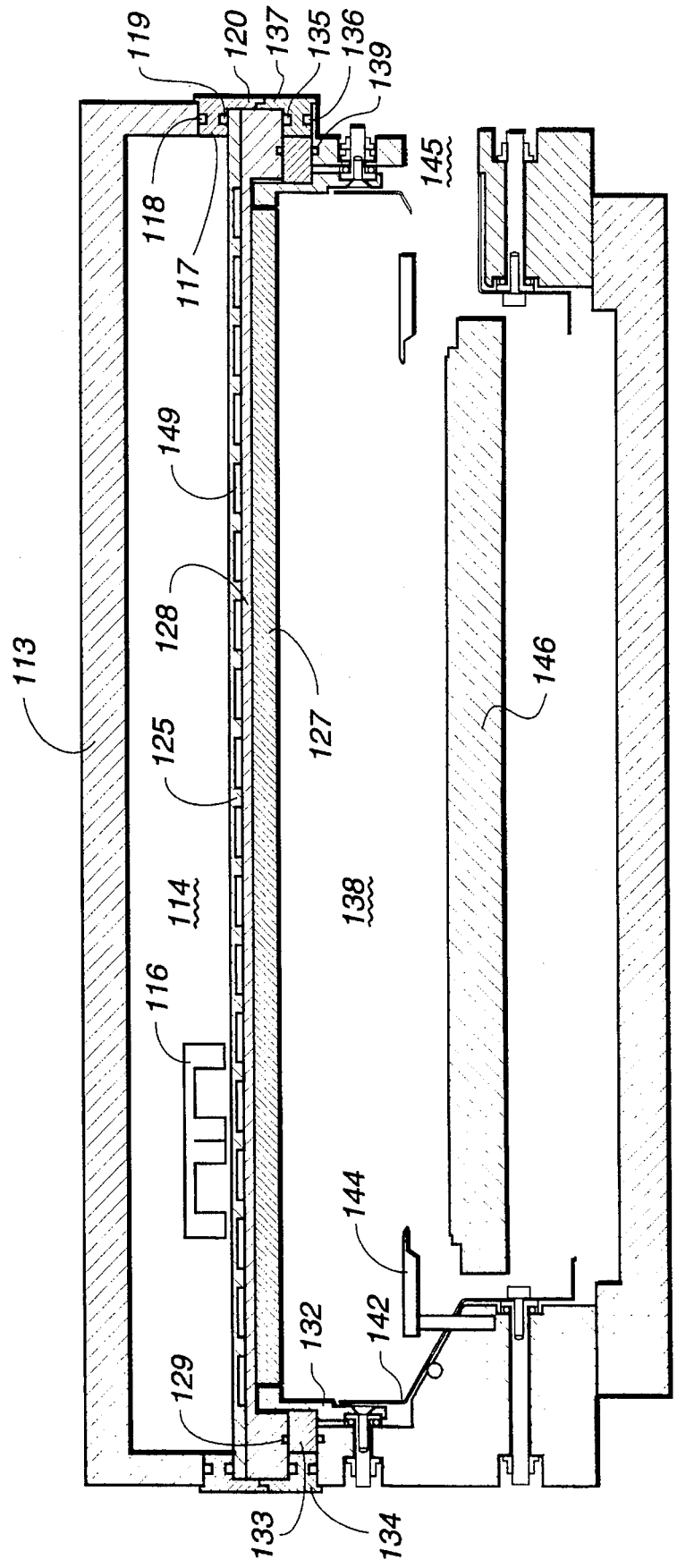
FIG. 31 is a cross sectional view of a sputtering device according to the invention showing a target assembly having a cooling cover plate with grooves therein according to the invention in context.

A clear understanding of the details of an embodiment according to the invention can be shown by reviewing the cross section of a sputtering device as shown in FIG. 31. The sputtering/processing chamber 138 is accessed through a slit valve 145 such that a substrate to be deposited (not shown) is delivered to a sputtering pedestal 146. The sputtering pedestal 146, being movable, is then moved vertically into position by vertical adjustment means (not shown) opposite the sputter target 127. A shadow frame 144 covers the outside edge of the substrate to prevent deposition on its edge. The sputtering/processing chamber 138 is lined with an over-spray shield or chamber liner 142. This liner 142 is more easily removed and cleaned than the chamber internal surfaces. The sputtering/processing chamber 138 has a top flange O-ring groove 139 to contain a sealing O-ring (not shown). An insulating ring, e.g. a ceramic (alumina) ring 133 (similar to item 73 shown in FIG. 3) rests on the top flange of the processing chamber 138. An outer insulator 134 surrounds the ceramic insulator 133 and has a lower O-ring groove 136, an upper O-ring groove 135, and an upward projecting insulating skirt 137. O-rings preferably made of Viton (not shown) are disposed in these grooves. The outer insulator 134 slightly overlaps the outside corner of the processing chamber upper flange. This slight overlap precisely locates the outer insulator 134 as well as the ceramic insulator 133 on the upper flange of the processing chamber 138. A dark space shield 132 is located inside the ceramic insulator 133 and projects upwardly towards the target backing plate 128.

The target assembly 124 in this embodiment according to the invention includes a target 127, a target backing plate 128 and a backing plate cooling cover 125 having cooling grooves 149 therein. This target assembly 124 has a target backing plate O-ring groove 129 to seal against ceramic insulator 133 using an O-ring (e.g. Viton) (not shown). The upward projecting skirt 137 of the outer insulator 134 along with the upward projecting dark space shield 132 locates the target assembly on the processing chamber 138.

Once the target assembly 124 is in position, an upper insulator 117 having a lower O-ring groove 119 and an upper O-ring groove 118 both having O-rings (not shown) rests on the top of the target assembly, specifically on the back of the backing plate cooling cover 125. The back of the cover plate 125 may be covered by a thin sheet of insulating material such as G11 glass epoxy laminate (shown in FIG. 7, but not shown in FIG. 31). Because the target assembly is highly electrically biased during processing, it is necessary to completely cover it and to insulate it from accidental grounding by being touched by an operator or another piece of processing equipment. Therefore the upper insulator 117 has a downward projecting insulating skirt 120 which overlaps the upward projecting insulating skirt 137 of the outer insulator 134 thereby providing a complete cover around the edge of the target assembly. The outer insulator 134 and the upper insulator 117 can be constructed of a variety of plastics, for example, acrylic or polycarbonate.

Figure 32:
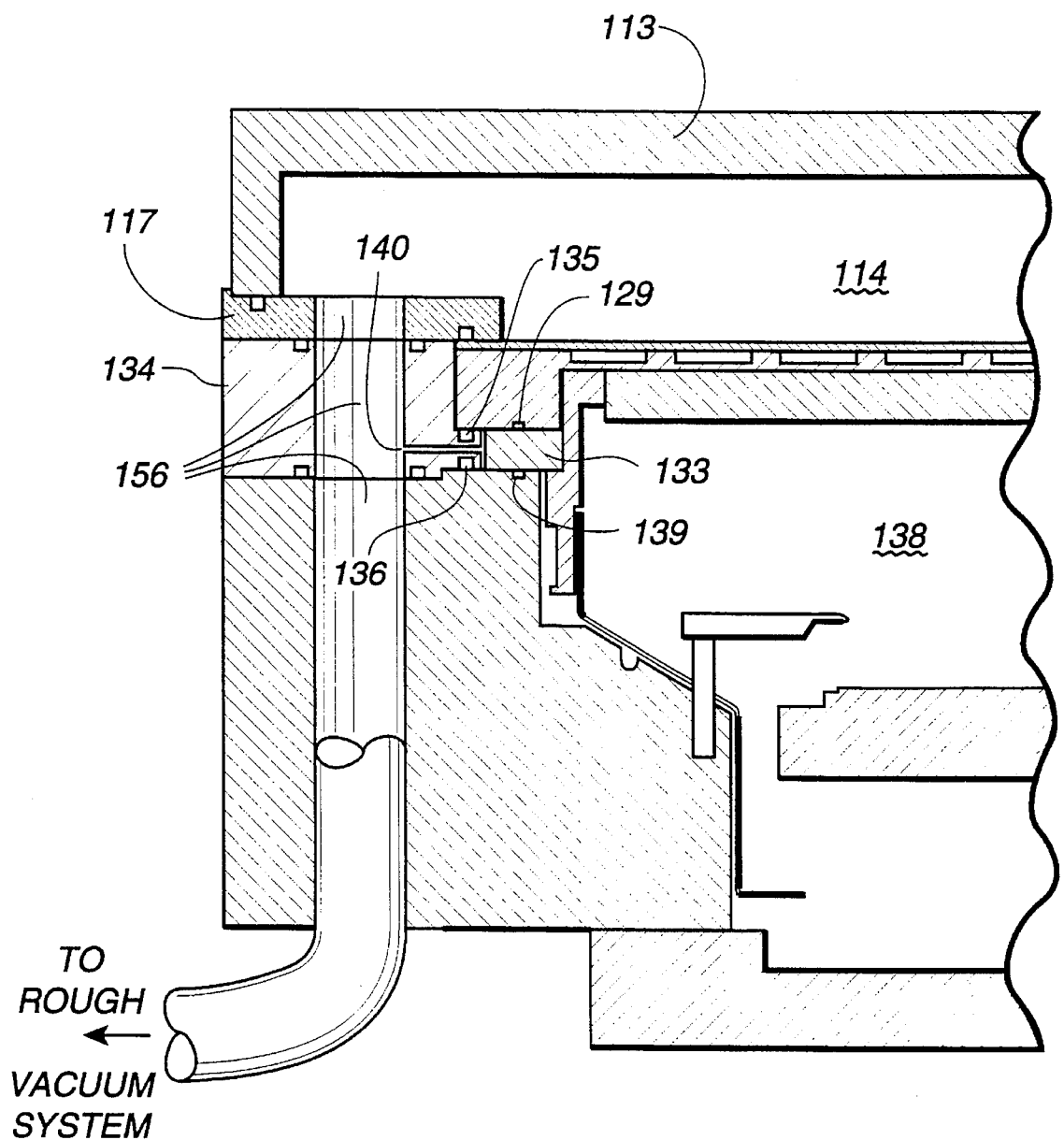
FIG. 32 is a cross sectional detail view of the rough vacuum passage connection to the intermediate seal space around the processing chamber according to the invention for the configuration of FIG. 31.

As shown in FIG. 32, a rough vacuum connection is routed at the edge and around the process chamber 138 to the top chamber 114 via a rough vacuum passage 156 attached to the outer insulator 134. The magnet sweep mechanism 116 and sensors (not shown) are separately connected and mounted to the top chamber cap 113.

The top chamber cap 113 is supported and sealed against the upper insulator 117 and located by a small flange around the upper insulator's perimeter. A movable magnet 116 (FIG.

31) is manipulated by a magnet sweep device (not shown) to linearly and reciprocally move the magnet to magnetically assist sputtering according to the sweep path of the device. When the processing chamber 138 is evacuated to process conditions (approximately $10^{-8}$ torr) and the top chamber 114 enclosed by the cover 113 is evacuated to a rough vacuum (e.g. 1 torr), there will be only approximately 1 torr of differential pressure across the target assembly plate. A differential pressure of 1 torr across a target assembly plate having an area of 1 sq. meter will provide a force of approximately 30 lbs. or 3.6 kg on the whole of the plate. Compare this to approximately 22,780 lbs. or 10,330 kg force that would be experienced if the pressure in the cap were to remain at approximately 1 atmosphere. A force of approximately 23,000 lbs. on a thin target assembly would provide a substantial deflection at the center of the target while in comparison a force of approximately 30 lbs. over the target, even for a relatively thin and large target, would have very little effect. Even at pressures of up to 10 torr in the top chamber, the pressure applied to and thus the deflection of the target assembly is significantly reduced from those produced by atmospheric pressure. If the pressures in the two chambers 114 and 138 were equal, there would be no differential force on the target at all.

The process chamber 138 and top chamber cap 113 are both initially connected to a rough vacuum (~torr) system. When the pressure limits of the rough vacuum subsystem are reached, the process chamber 138 is isolated and a cryogenic vacuum pump is activated to bring the process chamber pressure down to $10^{-9}$ torr or less. Inert gas, e.g. argon, is then introduced to bathe the substrate and target in argon at a pressure of approximately $10^{-3}$ torr. The top chamber 114 continues to be connected to the rough vacuum system. Conventional methods of increasing and decreasing the pressure differential between chambers can be used to raise or lower the differential.

The sputtering target is provided with a back-up (dual seal) sealing means. Vacuum is pulled in the cavity formed by the primary vacuum seal and its back-up seal (differentially pumped seal) in order to improve vacuum pumping of the process chamber. A double seal system is employed to assure a tight seal around the processing chamber 138 and to minimize gas diffusion through the seals by reducing the pressure differential across the seal. As can be seen in FIG. 32, the rough vacuum system is connected to and passes through the process chamber housing rough vacuum passage 156. The outer insulator 134 vacuum passage includes a between seal vacuum passage 140 to depressurize (to the rough vacuum pressure) the space between the O-ring seals around the ceramic (lower) insulator 133. Two 0.09 in. (2.3 mm) deep slots, for example, can be used for the seal vacuum passage 140. The possibility of undesired sputtering in this passage to the charged target assembly is eliminated by the insulating properties of the polycarbonate outer insulator 134.

If the erosion of the target due to sputtering is uneven and the center of the target erodes more quickly than the perimeter, as it does according to many magnet sweep patterns, the pressure under the top chamber cap 113 can be adjusted to deliberately control the deflection in the center of the target assembly so that the distance between the object being sputter deposited and the target surface remains generally constant to provide more uniform deposition across the surface of the substrate to be sputter coated. For example a proximity sensor, optical sensor, or other non-contact measuring instrument could be used to feedback the target's displacement and maintain a desired configuration.

Figure 33:
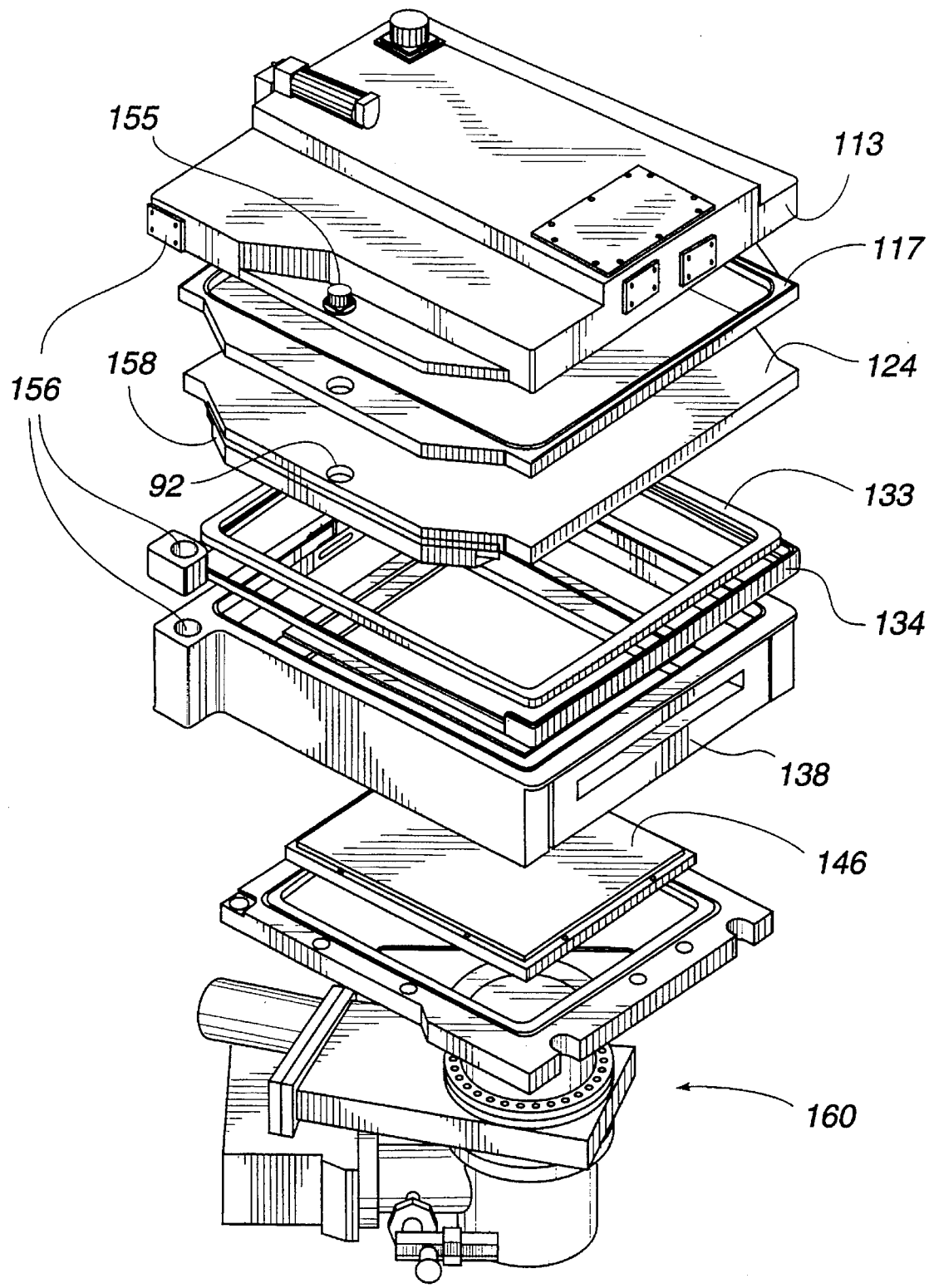
FIG. 33 is an exploded view of an embodiment according to the invention whose cross section is generally shown in FIG. 31.

FIG. 33 shows an exploded perspective view of the sputtering device pictured in FIGS. 31 and 32. The target assembly 124 is shown already attached to a cooling fluid manifold 158. In this configuration, this cooling fluid manifold usually made from a non-conducting plastic such as polycarbonate is attached by means of the cooling attachment screw holes to the target assembly 124. Piping having non-conducting properties such as neoprene hoses is attached to this polycarbonate manifold, to circulate a highly resistive, e.g. 200 K ohm/in. minimum, cooling fluid. In this configuration a fluid path (hose length) of at least approximately 2 ft in length prevents large currents from leaking through the cooling fluid to connected machinery. A power connection 155 for the target assembly 124 is configured to intimately connect with the target backing plate through the power connection hole 92 (FIG. 12) in the top of the target assembly 124. The upper insulator 117 surrounds top chamber cap 113.

Figure 34:
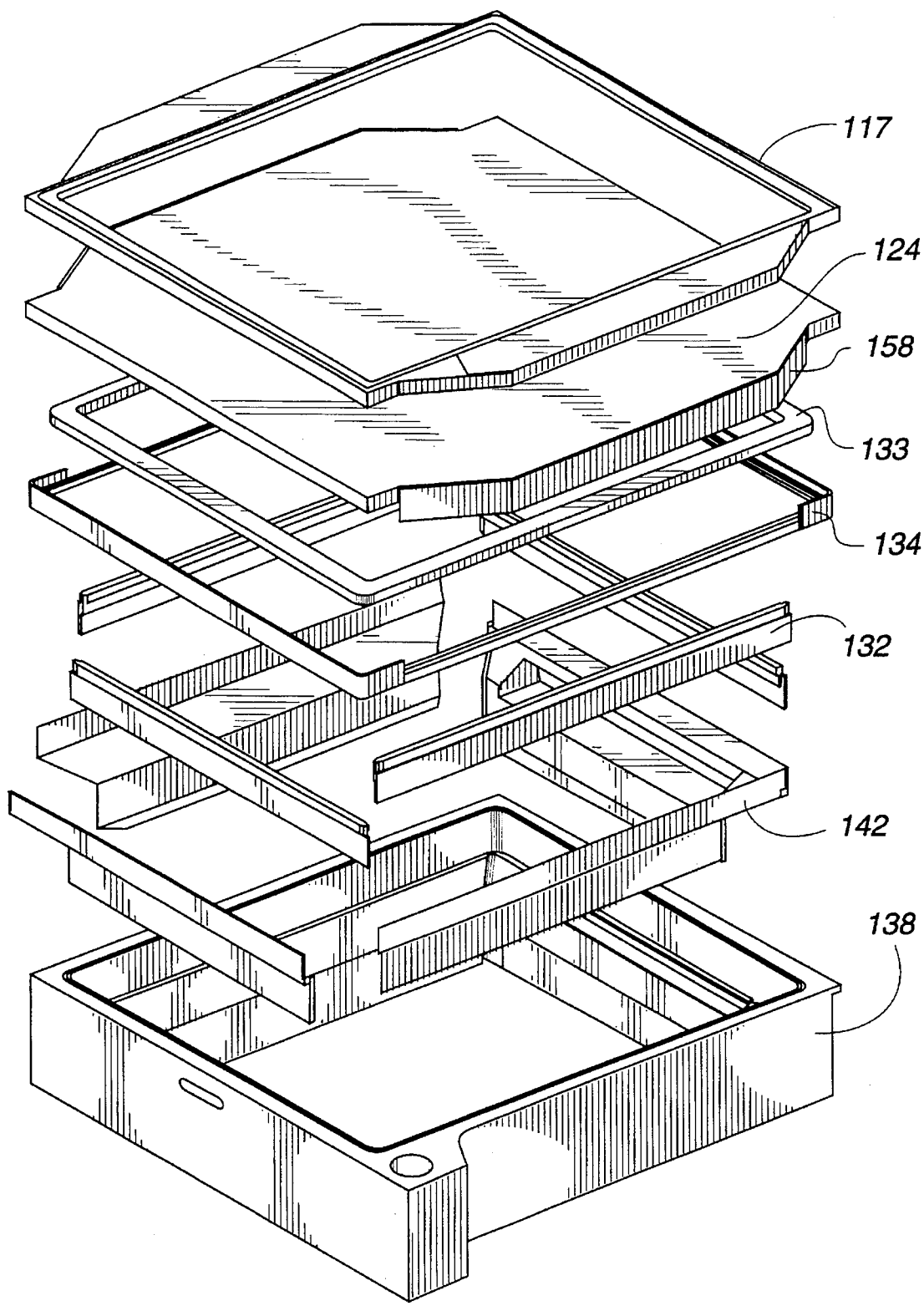
FIG. 34 is an exploded view of the various insulating and process chamber lining pieces of FIGS. 31, 32, and 33.

FIG. 34 shows the various insulating pieces in an exploded view so that their configuration can be more easily understood. The processing chamber 138 receives the over-spray shield chamber liner 142. The dark space shield 132 fits inside the over-spray shield 142. The outer insulator 134 sits on the top flange of the processing chamber 138 and surrounds the ceramic insulator 133 (the vacuum passage 156 attached to the outer insulator 134 is not shown). The target plate assembly 124 is shown with its cooling fluid manifold 158 in place. The upper insulator 117 is shown disposed above the target assembly 124. In FIG. 34, various pieces are shown in two or more sections. These pieces may be constructed as one or more pieces in their final configuration, depending on manufacturing considerations.

Figure 35:
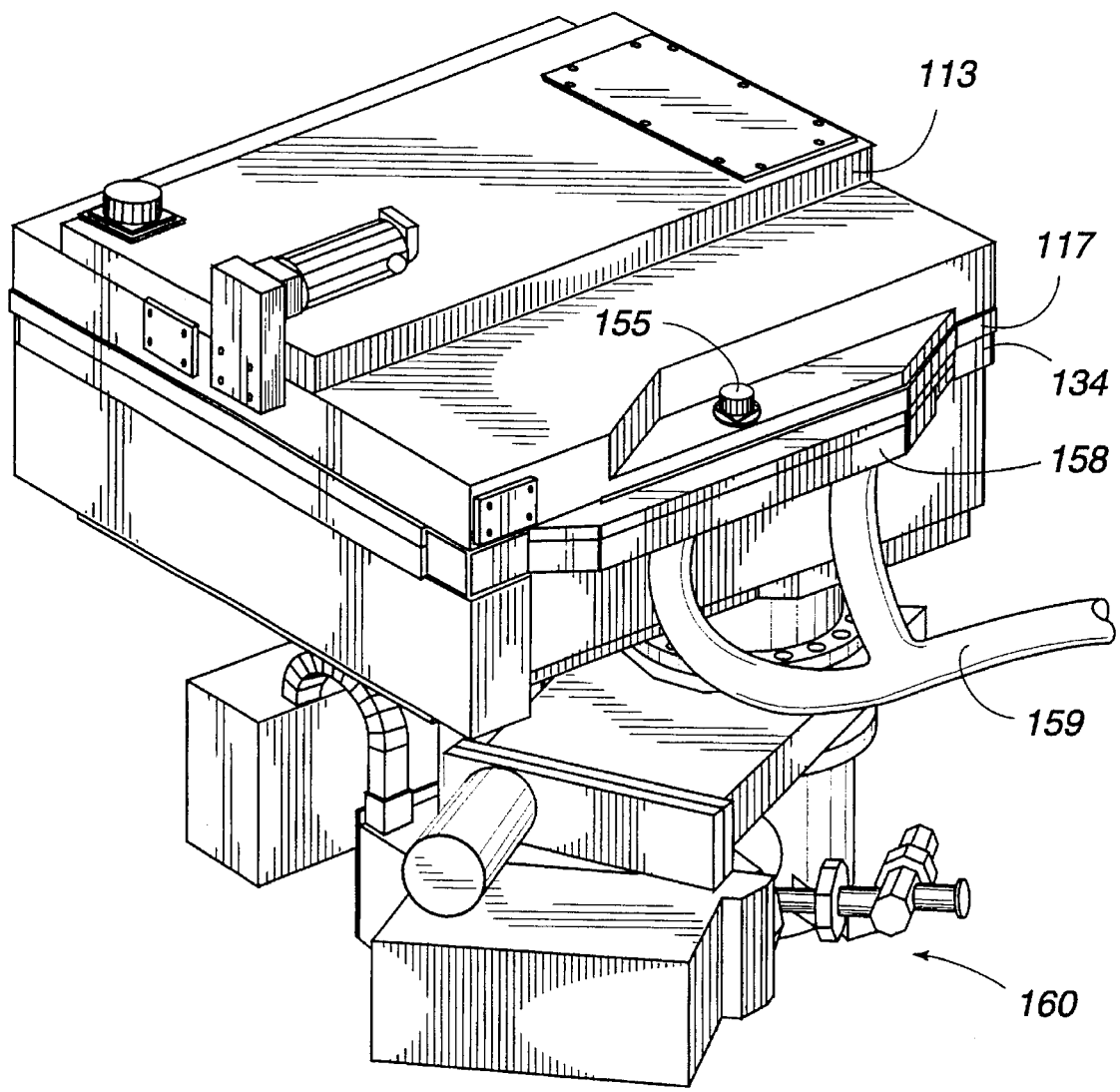
FIG. 35 shows a perspective view of the outside of a process chamber according to the invention as might be observed when the exploded parts as shown in FIG. 33 are assembled.

FIG. 35 shows an assembled device according to the invention such that the exploded view of FIG. 33 is now assembled. A cooling fluid hose 159 is shown connected to the cooling fluid manifold 158, which can be made part of the outer insulator 134. The outer insulator 134 is shown adjacent to the upper insulator 117, both of which enclose the target assembly 124 (not shown here) to prevent anyone from contacting the energized target assembly. The power connector 155 for the target assembly is shown in a flange adjacent to the top chamber cap 113.

Another embodiment according to the invention is shown in FIGS. 36–40.

Figure 38:
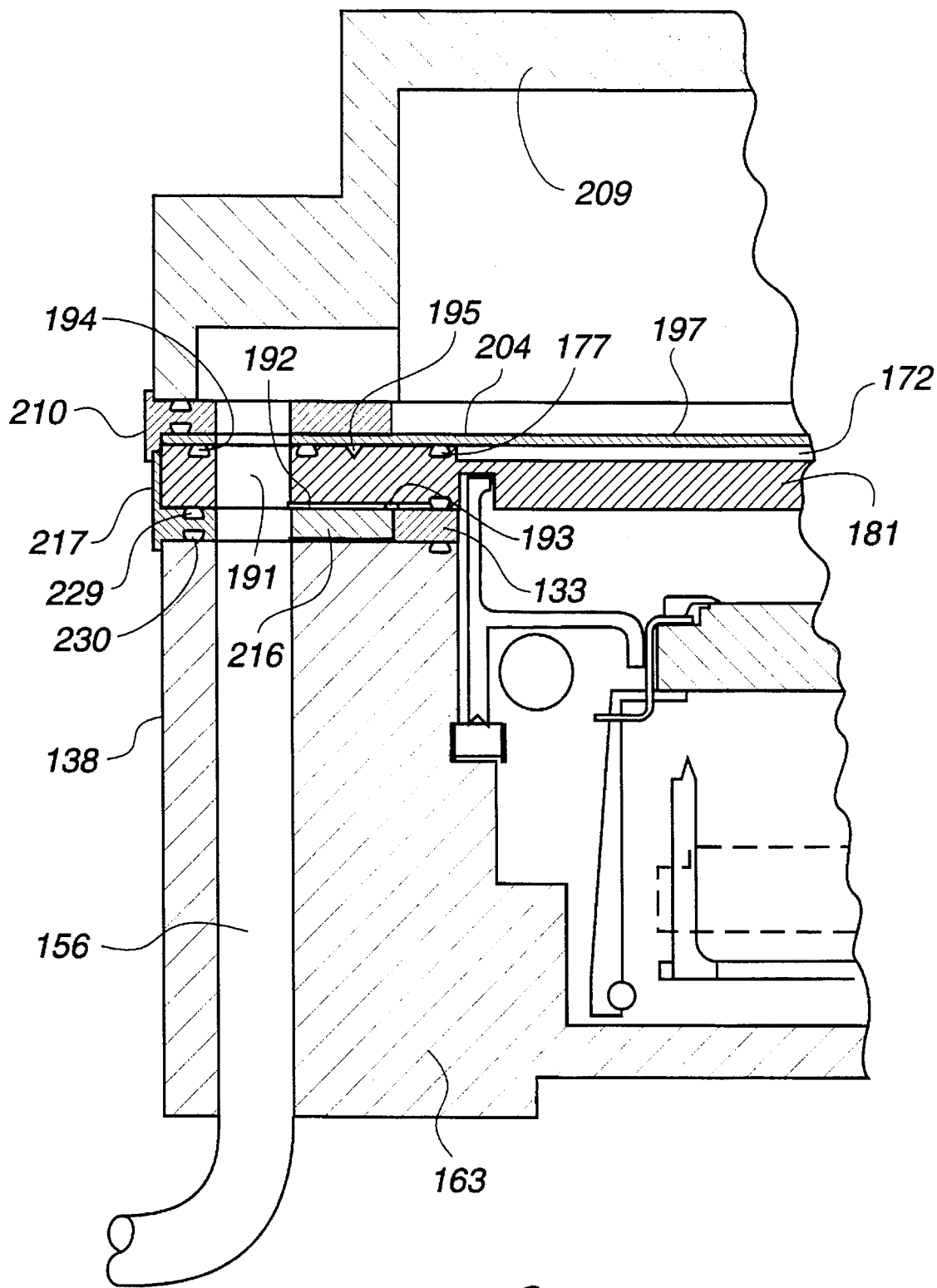
FIG. 38 is a cross section of the sputtering chamber of FIG. 40 according to the invention showing the vacuum passages and sealing to the rough vacuum system.

FIG. 38 shows a partial cross section of another configuration according to the invention using the target backing assembly shown in FIGS. 19 through 26. The chamber side wall 163 has a passage 156 connecting to a rough vacuum system. The upper pan of the chamber side wall 163 above passage 156 supports and connects to a lower outer insulator 216 having O-ring grooves 229 and 230 outside the passage 156. A lower surface of the insulator 216 has a slightly less than full thickness to permit the rough vacuum to evacuate all the way to the outside of the ceramic seal 133. The lower surface of the target assembly includes the vacuum passage connecting groove 192 between the vacuum passage 191 and the vacuum perimeter distribution groove 193. The target backing plate upper face includes the groove arrangement as detailed for FIGS. 27 and 28. The upper insulator 210 is sealed between the cap 209 and the top surface of the target assembly 213. The upper insulator 210 has a skirt projecting over the upwardly projecting skirt 217 of the lower outer insulator 216.

Figure 36:
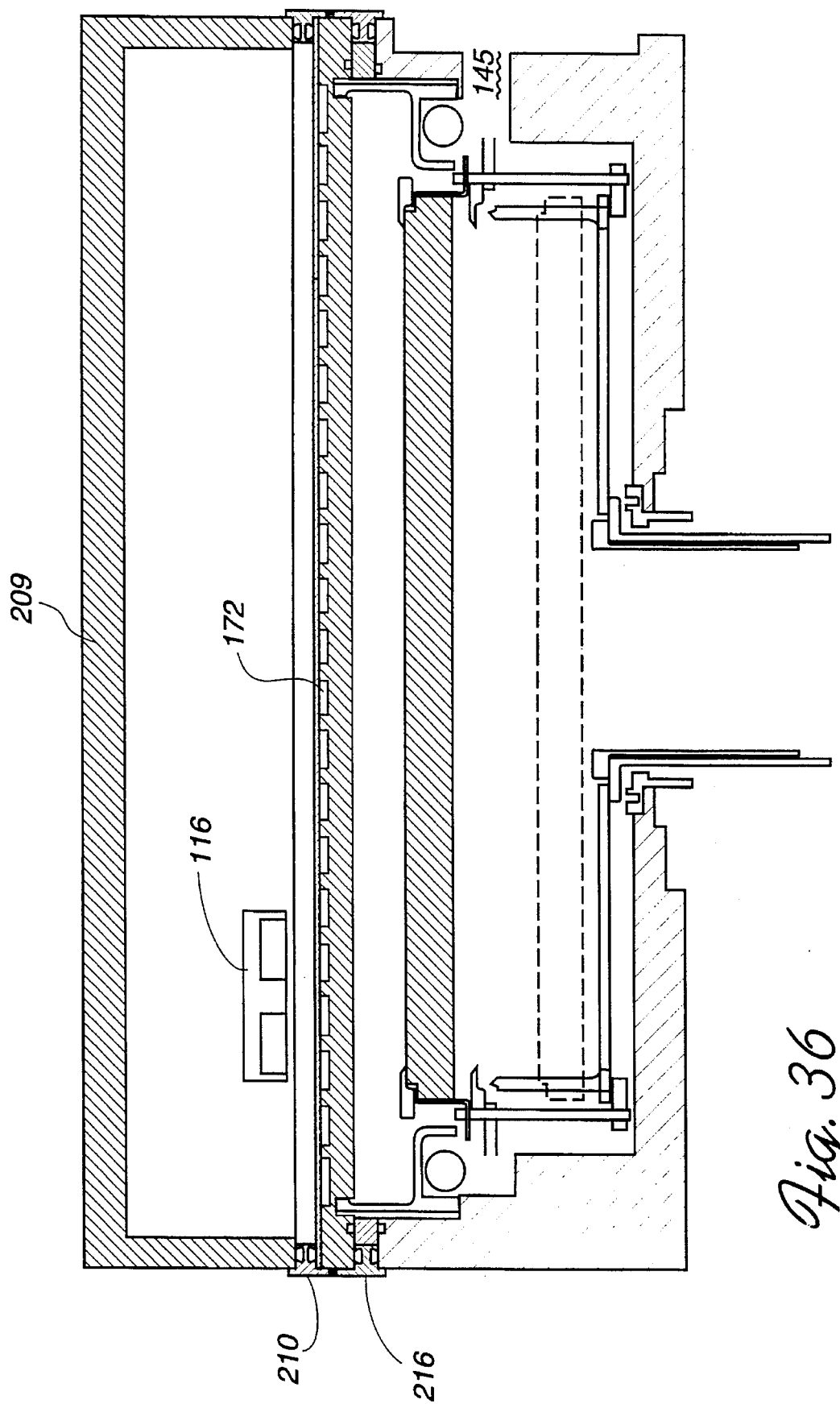
FIG. 36 shows a cross section of another sputtering chamber according to the invention taken at section line 36—36 of FIG. 40.
Figure 37:
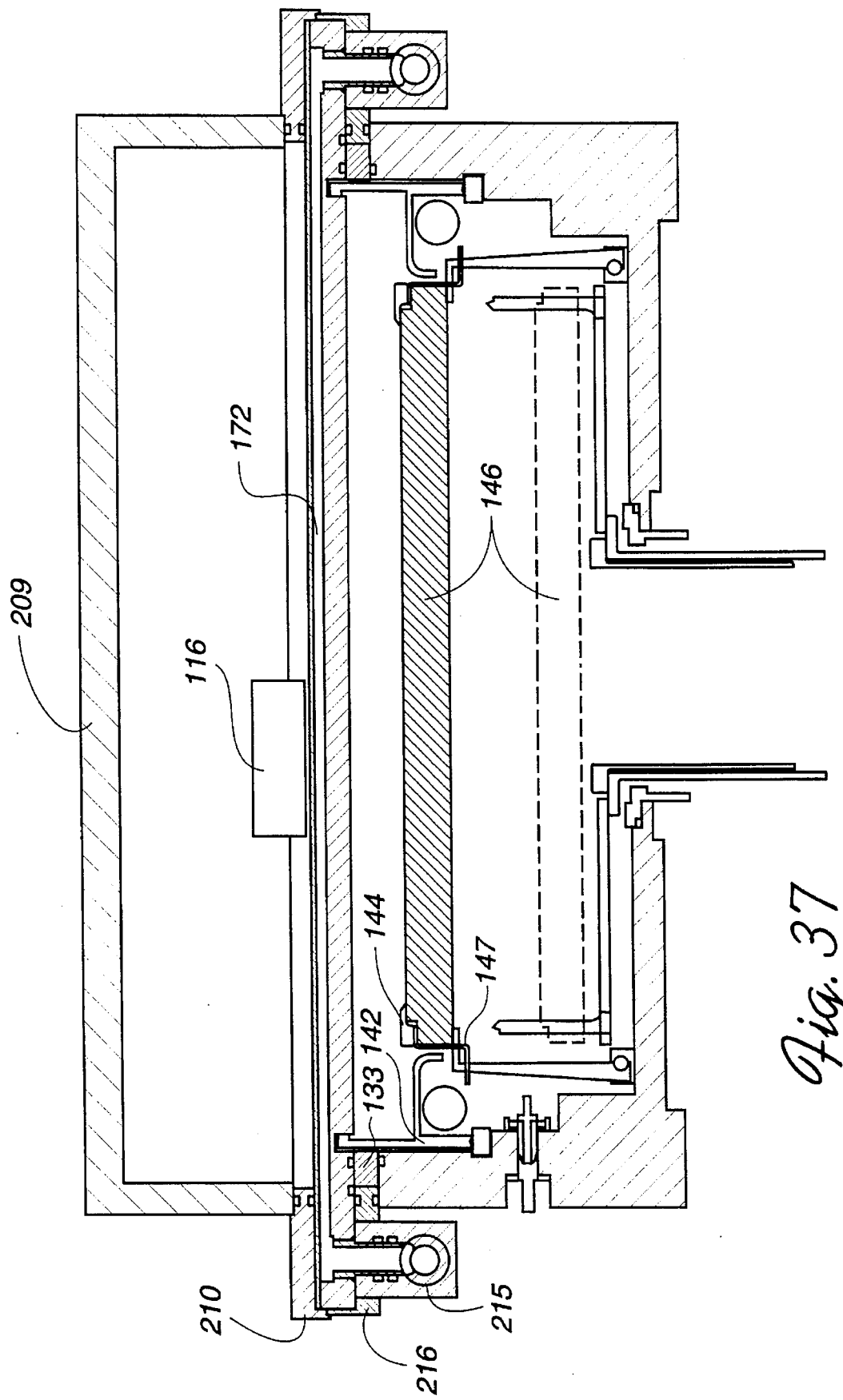
FIG. 37 shows a cross section of the sputtering chamber of FIG. 40 taken at section line 37—37.
Figure 39:
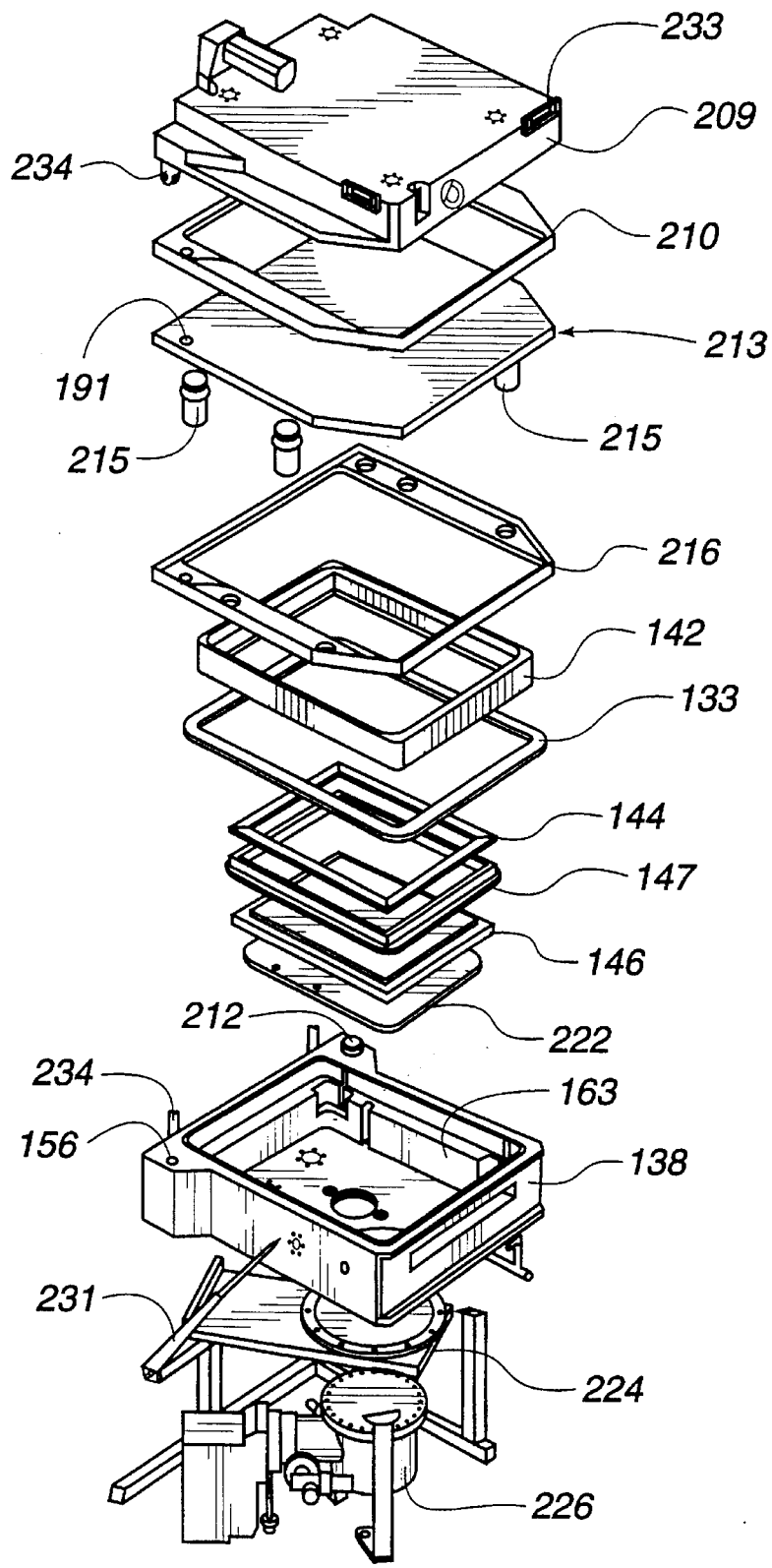
FIG. 39 is an exploded view of another embodiment of a sputtering chamber according to the invention.
Figure 40:
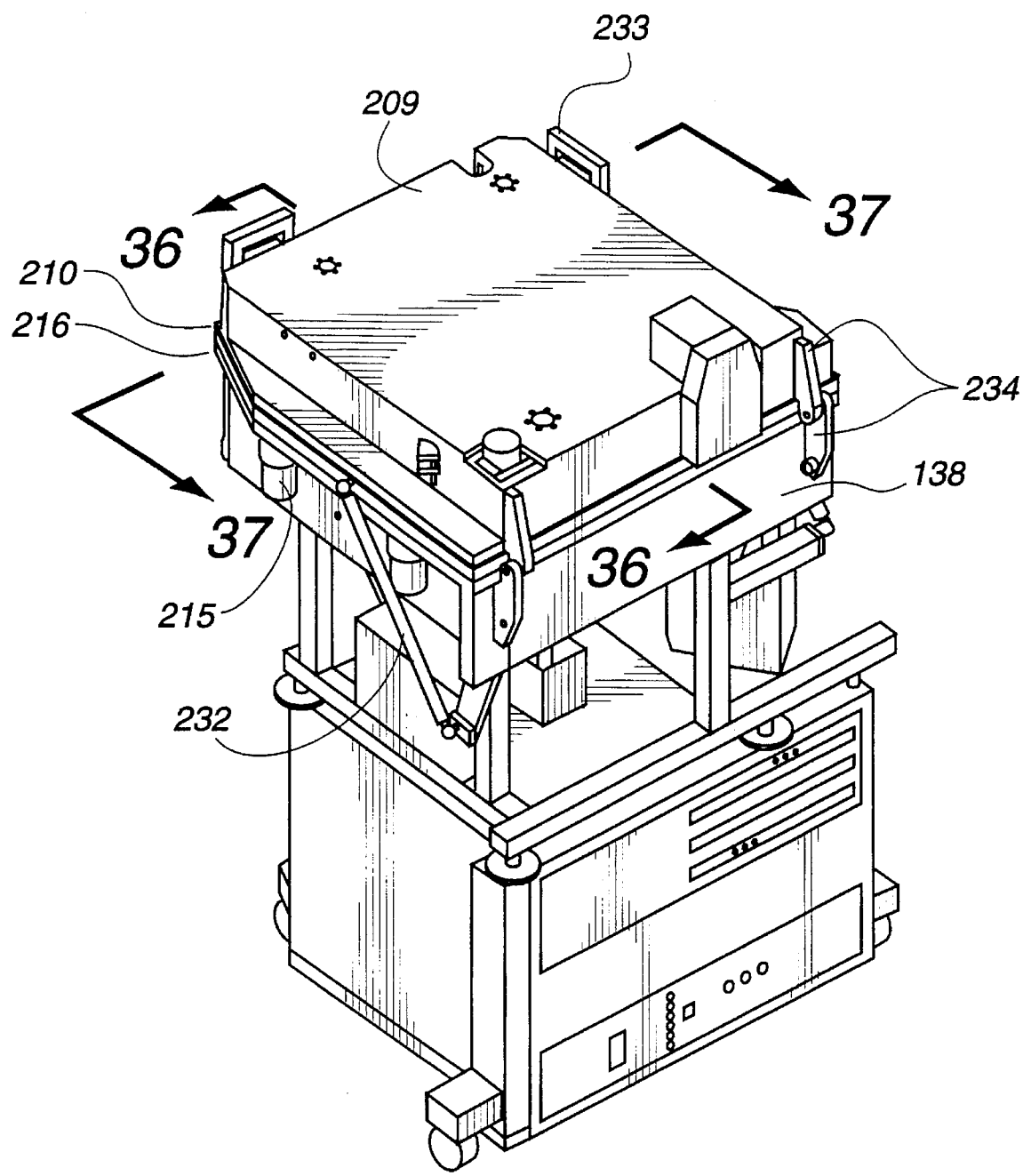
FIG. 40 shows a perspective view of an assembled sputtering chamber of FIG. 39.

FIG. 39 shows an exploded view of a processing chamber according to the invention. FIG. 40 shows the exploded parts of FIG. 39 assembled, while FIGS. 36 and 37 show cross sectional views of the processing chamber as shown in FIG. 40 taken at sectional lines 36—36 and 37—37 respectively. In this configuration the top chamber cap 209 is loosely hinged on the process chamber enclosure 163 by hinge pieces 234. A pair of gas pressurized cover lifting rams 231, 232 assist a user using the lift handles 233 to lift the top chamber cap 209 and pivot it out of the assembly path when changing the target assembly 213. The processing chamber enclosure 163 is supported on a frame. The frame also supports a gate valve 224 connected between a cryogenic pump 226 and the bottom of the processing chamber enclosure 163. Within the processing chamber 138 there is a fin plate 222, the sputtering pedestal 146, the overspray shield 147, the shadow frame 144, and the dark space shield 142 which fits around the inside of the chamber.

The previously discussed embodiment allowed the rough vacuum to be passed around the target assembly through passages of the upper and outer insulators. In this embodiment, the target assembly includes two square corners at one end. In one corner the vacuum is routed through hole 191 to the top chamber cap 209 from the rough vacuum system. The rough vacuum is routed to the under side of the processing chamber through a fixed passage 156 along side the processing chamber to the top surface of the processing chamber. It is easier to connect to and disconnect from a fixed passage. The rough vacuum in this embodiment passes through the fixed passage 156 in the chamber wall 163 and through the vacuum passage 191 in the target assembly which is separate from the fluid containing passages.

The ceramic insulator 133 sits on the upper flange of the processing chamber enclosure 163. The lower outer insulator 216 fits around the ceramic insulator 133. The target assembly 213, with attached cooling water fittings 215 (encased in non-conductive material) is then placed on the ceramic insulator 133 and lower outer insulator 216. Once in place, the target assembly has its perimeter covered by an upper insulator 210 which supports the cap top cover piece 209.

Another model for the cooling water fittings 215 is shown in FIG. 37 when a manifold is slipped onto smooth surfaced tubes extending from the target assembly 213. O-rings seal the manifold to the outside of the smooth tube. One or more screws hold the manifold to the target assembly and keeps it from slipping off the smooth tube ends.

The target of this configuration is shown in FIG. 19. The cooling inlet and outlet features 179a,b,c,d are threaded with a pipe hex nipple having SAE type threads at one end and a cylindrical smooth (preferably polished) surface at the other end which can mate with a hole of the manifold having interior O-ring grooves to seal the fluid connection. This connection can for example be used when a single manifold is designed to slide over the a set of two cooling features at one end of a target.

The hinge pieces 234 illustrated in FIGS. 39 and 40 have some play or looseness in their connections to allow for movement when vacuum is applied and removed from the processing chamber 138 and cap 209.

Safety Power Connector

Figure 41:
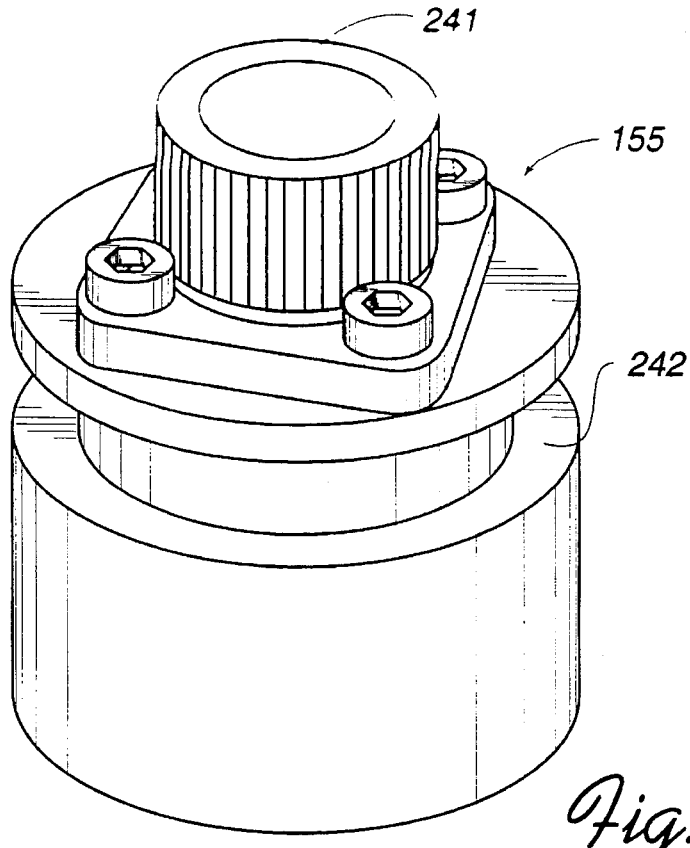
FIG. 41 is a perspective view of a power connector fitting, according to the invention.
Figure 42:
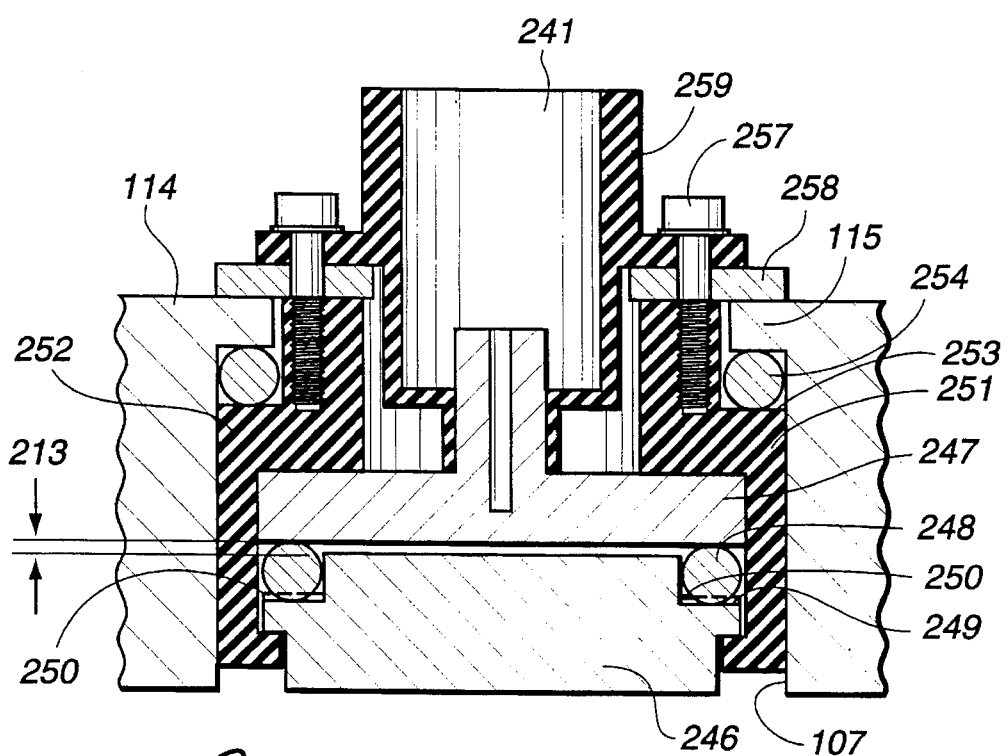
FIG. 42 shows a cross sectional view of the power connector fitting, according to the invention.

FIG. 41 shows a perspective view of the safety power connector assembly 155 used to connect electrical power to the target backing plate 128. The cross section of the power connection assembly and its flange connection is shown in FIG. 42. The power cable (not shown) is connected into the top opening 241. A circumferential groove 242 mates with the edge of the counterbore of the top chamber flange 114 (FIG. 42) of the top chamber cap 113. A safe contact 246 sits adjacent to the target assembly in the power connection opening 92.

A live contact 247 is separated from the safe contact by a lower O-ring 248. The lower O-ring 248 does not lay flat on the safe contact's outer ledge 249 but is supported by several fins 250 (for example four) spaced around the perimeter of the ledge 249. Under ambient conditions the live contact is separated from the safe contact by approximately 0.030 inches. Two halves of an outer casing 251, 252, for example made of polycarbonate, encircle and capture the O-ring 248 and the live and safe contacts 247, 246. An upper O-ring 254 is located on the upper ledge 253 of the outer casings 251, 252 and the assembly is slipped from the bottom into the electrical connecting bore 107 of the top chamber flange 114. A counter bore lip 115 of the top chamber flange 114 retains the contact assembly 246, 247, 248, and a retaining screw 257 and plate 258 secure the contact assembly to the flange 114. An end piece 259 (polycarbonate or a commercially available electrical connector) protects the central power feed from the surrounding objects and persons. The power feed wire (not shown) contacts directly with the live contact 247 at the bottom of the top opening 241. The live contact 247, safe contact 246 and O-ring 248 float in the casing 251, 252.

Under ambient conditions the live contact 247 is energized but the safe contact 246 is not because it is separated from the live contact by the uncompressed O-ring 248 and an uncompressed space 213 between the two contacts. When a vacuum is pulled in the top chamber 113 inside the top chamber cap 114, the top chamber flange 114 moves down, pressurizing the full contact O-ring 254 pressing the casing 251, 252 down. Once the safe contact is firmly seated on the target it can travel no further. Further movement, which is normal under vacuum pumping of the casing, causes the lower O-ring 248 to be compressed over the raised fins 250 (e.g., 10–15 lbs. resistance) causing the space 213 to disappear and the live and safe contacts to meet resulting in an electrical connection. When the target is not fully enclosed by the insulators (as discussed elsewhere) it cannot be energized, because the absence of a tight seal will prevent a vacuum from being formed. Therefore the top chamber can be handled safely (albeit carefully) without any live electrical terminals exposed.

Figure 43:
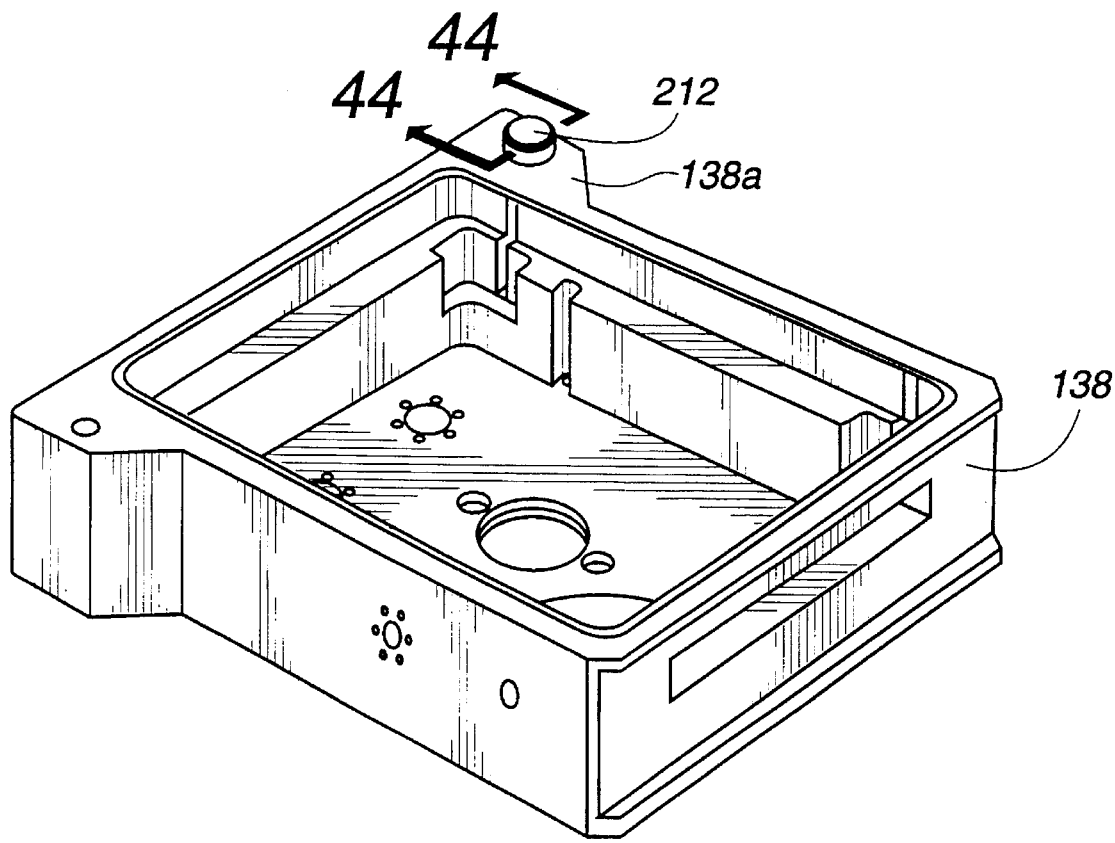
FIG. 43 shows a close-up perspective view of the processing chamber 138 shown in FIG. 39.
Figure 44:
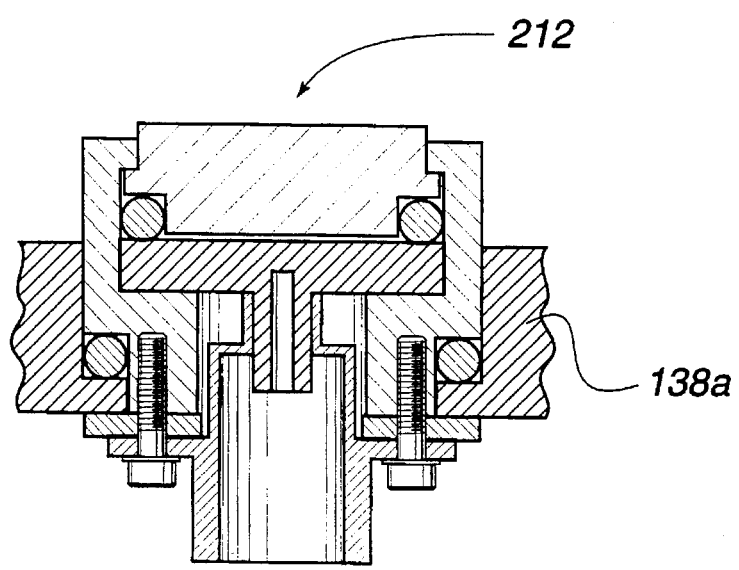
FIG. 44 shows a cross sectional view of a safety electrical connector cut at section line 44—44 shown in FIG. 43.

The electrical connector 212 shown in FIG. 44 (and as previously detailed in an inverted orientation in FIG. 42 for attachment to the top chamber cap 113) for this configuration hangs from the bottom of a top flange 138a of the processing chamber 138 (FIG. 43). This connector 212 extends beyond the top surface of the top flange 138a of the processing chamber and peeks out through an opening in the lower outer insulator 216 to contact the bottom surface of the target assembly 213 when the unit is assembled. When vacuum is applied to the processing chamber 138 to pull the target assembly 213 tightly to the processing chamber 138 enclosure 163, the electrical connector 212 is compressed, thereby closing the contacts to energize the target assembly.

The internal configuration of the insulated power connector for the target plate contributes to the safety of the processing operation. At ambient conditions a gap between internal energized conductor pieces and outer surfaces of the connector insulates the target from the energized portion of the connector. However, when the vacuum pump depressurizes the chamber, the external forces created by the vacuum overcome the elastic force separating the energized contacts from connecting to the target and thereby creates a good connection. When the safety power connector is located in a flange adjacent to the process chamber facing up, the connector contact closes when a vacuum is pulled in the processing (lower) chamber. However, in this configuration, for safety reasons the power connector is not energized until an electrical interlock requiring that the upper chamber be under vacuum is satisfied.

Advantages

The target assembly is doubly sealed such that a vacuum may be pulled from both the side of the process chamber side and the side of the magnetron chamber. The process/ deposition parameters such as magnetron electrical impedance, substrate film thickness uniformity, etc., can be controlled somewhat using two chambers. The target assembly deflection can be controlled by varying the pressure between the two chambers. The target configuration as described provides no welds or other joints separating the cooling passages from the process chamber. There are no welds exposed to vacuum and therefore the possibility of leaks through defects in joints is completely eliminated apart from leaks from defects in materials. The sputtering target assembly and its cooling system are self-contained and upon replacement or removal of the target assembly, there is no water dripping or contamination of the sputtering chamber since its design consists of a serf-contained heat exchanger. When the cooling fluid passing through its passages is at a temperature higher than the surroundings, the target assembly is warmed to reduce or accelerate out-gassing of the target (reducing this effect during processing, and eliminating condensation on the surface of the target assembly surfaces). There is no coolant-to-vacuum seal in any of these configurations. A sputtering target assembly of this configuration can be of a large size and a low profile. Such an assembly even if much larger than the current design, will deflect negligibly under vacuum applied from both sides.

The sputtering target assembly may have its cooling cover plate made of a non-electrically conducting material such as glass epoxy laminates (G-10 or G-11/FR4) or prepreg formed. This non-electrically conducting material can be joined to the target backing plate using a suitable low curing-temperature and low pressure adhesive, such as structural-type epoxies. The non-electrically conducting cooling cover plate/heat exchanger material can be configured to completely surround all exposed sides of the target to ensure electrical safety for operators.

The advantages of this device over the prior art include, once assembled, a one-piece target assembly which is interchangeable with other target assemblies without the danger of any cooling liquid being spilled into the sputtering-processing chamber. When large areas are to be sputtered which require larger processing and magnetron/pressure equalizing chambers, the deflection of the target assembly due to pressure differential across the target assembly is controlled or eliminated. The pressure of cooling liquid in the assembly is contained in the cooling passages by various securing techniques, including adhesive gluing the target backing plate to the cover plate or by various diffusion bonding techniques, brazing with or without mechanical fastening assistance. When properly done, there is virtually no possibility of coolant leakage in spite of the fact that differential pressure through and across the cooling passages is expected to reach several atmospheres when the cooling fluid is pressurized. Heat exchanger coolant passages can easily be re-designed to optimize the cooling temperature distribution as desired and based on empirical data. Another advantage of the thin planar laminated target of the invention is that the magnetron magnets can be scanned relatively closely to the target. Thereby, lower strength magnets can be used and their magnetic field shapes can be more flexibly tailored.

While the invention has been described with regard to specific embodiments, those skilled in the art will recognize that changes can be made in form and detail without departing from the spirit and scope of the invention. For example, the evaluations described here are merely representative of the invention and should not be considered to limit the scope of the invention to the method or structure herein described.

We claim:

1. A sputtering assembly comprising:
   a sputtering target in intimate contact with a first side of a target backing plate assembly;
   said target backing plate assembly having a first side configured to cover an opening of a sputtering chamber so as to seal the opening;
   a top chamber having a bottom opening sealed against a second side of said target backing plate assembly opposite from said first side such that said target backing plate assembly acts as a wall between said sputtering chamber and said top chamber;
   wherein said target backing plate assembly is disposed between said bottom opening of said top chamber and said opening of said sputtering chamber so that a pressure load on said target plate assembly due to differential pressure between the chambers is reduced as the pressure in said top chamber and the pressure in said sputtering chamber approach one another,
   a top chamber pressure control system to control the pressure in said top chamber to be different from the pressure in said sputtering chamber,
   wherein a portion of said target backing plate assembly and sputtering target are configured to bow as the differential pressure between the top chamber and the sputtering chamber changes,
   wherein the pressure in at least one of the two chambers is adjustable to control the bow in a portion of the target assembly and a portion of the sputtering target to change the distance between said portion of said sputtering target and a portion of said object being sputter deposited so as to improve the uniformity of film thickness sputter deposited on the object being sputter deposited.

2. The sputtering assembly as in claim 1, wherein a connection from a vacuum source to said top chamber is routed through a rough vacuum port adjacent to said sputtering chamber and around said target backing plate assembly to said top chamber, such that positioning of the target backing plate assembly and the top chamber to be sealed for evacuation simultaneously provides a seal between said top chamber and said connection from said vacuum source.

3. A sputtering assembly as in claim 1, wherein said backing plate assembly has heat exchange fluid passages therethrough, said heat exchange fluid passages having one or more inlet and outlet openings.

4. The sputtering assembly as in claim 3, wherein said target backing plate assembly is configured without a seal between a passage or chamber at vacuum pressure and said cooling fluid passages.

5. The sputtering assembly as in claim 3, further comprising a non-contact measuring instrument to measure the displacement due to bowing of said portion of the target backing plate assembly from a reference location.

6. The sputtering assembly as in claim 5, wherein the instrument for measurement of the displacement due to bowing provides a feedback signal to said top chamber pressure control system so that pressure in said top chamber is adjusted to maintain approximately a desired distance between the object to be sputtered and a surface of said portion of said sputtering target whose location can be adjusted by changing the bowing of the target backing plate assembly and the sputtering target by changing the differential pressure between the top chamber and the sputtering chamber.

7. The sputtering assembly as in claim 1, further comprising a non-contact measuring instrument to measure the displacement due to bowing of said portion of the target backing plate assembly from a reference location.

8. The sputtering assembly as in claim 7, wherein the instrument for measurement of the displacement due to bowing provides a data signal to said top chamber pressure control system so that pressure in said top chamber is adjusted to maintain approximately a desired distance between the object to be sputtered and a surface of said portion of said sputtering target which can be bowed.

9. A sputtering process comprising the steps of:

placing a target assembly on a top surface of a processing chamber such that when a vacuum is provided to said processing chamber said processing chamber is sealed by said target assembly;

evacuating said processing chamber to provide a processing chamber vacuum pressure in said chamber sealed by said target assembly;

placing a cover chamber on said target assembly on a back side of said target assembly opposite a target side of said assembly, said cover chamber being supported on said back side of said target assembly such that a vacuum seal is created against said back side of said target assembly, thereby enclosing at least the portion of said back side of said target assembly corresponding to the location on said target side of said target assembly which comprises a sputtering target; and evacuating said cover chamber to provide a cover chamber vacuum pressure in said cover chamber;

setting and adjusting the differential pressure between said cover chamber and said processing chamber during sputtering to control the bowing of a portion of the target assembly located between the processing chamber and the cover chamber to adjust the distance between a portion of the sputtering target susceptible to movement due to bowing of the target assembly between adjacent chambers and an object to be sputtered to improve the uniformity of sputtering film sputter deposited on said object in said sputter chamber during sputtering of said sputtering target on said target side of said target assembly as a portion of said sputtering target susceptible to movement due to bowing is eroded away during sputtering.

10. The sputtering process as in claim 9, wherein the step of adjusting includes:

adjusting the differential pressure between said cover chamber and said processing chamber according to a measurement of the bowing of said portion of said target assembly between said processing chamber and said cover chamber.

11. The sputtering process as in claim 10, wherein the measurement is done by a non-contact measuring method.

* * * * *